(12) United States Patent
Mokhlesi

(10) Patent No.: US 7,920,422 B2
(45) Date of Patent: *Apr. 5, 2011

(54) ALL-BIT-LINE ERASE VERIFY AND SOFT PROGRAM VERIFY

(75) Inventor: Nima Mokhlesi, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/767,660

(22) Filed: Apr. 26, 2010

(65) Prior Publication Data

US 2010/0202207 A1    Aug. 12, 2010

Related U.S. Application Data

(63) Continuation of application No. 12/323,413, filed on Nov. 25, 2008, now Pat. No. 7,764,544.

(51) Int. Cl.
*G11C 11/34* (2006.01)
(52) U.S. Cl. .......... 365/185.03; 365/185.29; 365/185.19
(58) Field of Classification Search ............. 365/185.03, 365/185.29, 185.19
See application file for complete search history.

(56) References Cited

U.S. PATENT DOCUMENTS

| | | | |
|---|---|---|---|
| 6,009,014 A | 12/1999 | Hollmer et al. | |
| 6,545,912 B1 | 4/2003 | Pawletko et al. | |
| 6,987,693 B2 | 1/2006 | Cernea et al. | |
| 7,031,210 B2 | 4/2006 | Park et al. | |
| 7,362,616 B2 | 4/2008 | Bovino et al. | |
| 7,414,891 B2 * | 8/2008 | Sivero et al. | 365/185.18 |
| 7,499,327 B2 | 3/2009 | Kwak et al. | |
| 2008/0037307 A1 | 2/2008 | Goda | |

* cited by examiner

*Primary Examiner* — Son Dinh
*Assistant Examiner* — Nam Nguyen
(74) *Attorney, Agent, or Firm* — Vierra Magen Marcus & DeNiro LLP

(57) ABSTRACT

Techniques are disclosed herein for verifying that memory cells comply with a target threshold voltage that is negative. The technique can be used for an erase verify or a soft program verify. One or more erase pulses are applied to a group of non-volatile storage elements that are associated with bit lines and word lines. One or more non-negative compare voltages (e.g., zero volts) are applied to at least a portion of the word lines after applying the erase pulses. Conditions on the bit lines are sensed while holding differences between voltages on the bit lines substantially constant and while applying the one or more compare voltages. A determination is made whether the group is sufficiently erased based on the conditions. At least one additional erase pulse is applied to the group of non-volatile storage elements if the group of non-volatile storage elements are not sufficiently erased.

25 Claims, 15 Drawing Sheets

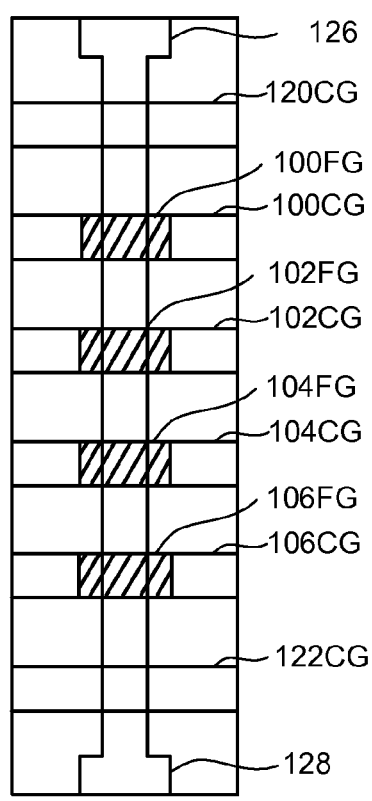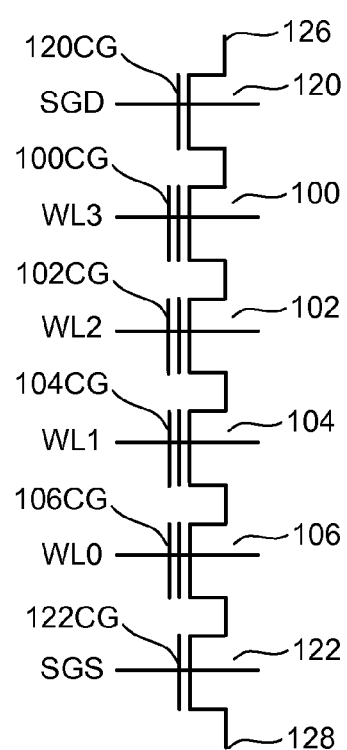

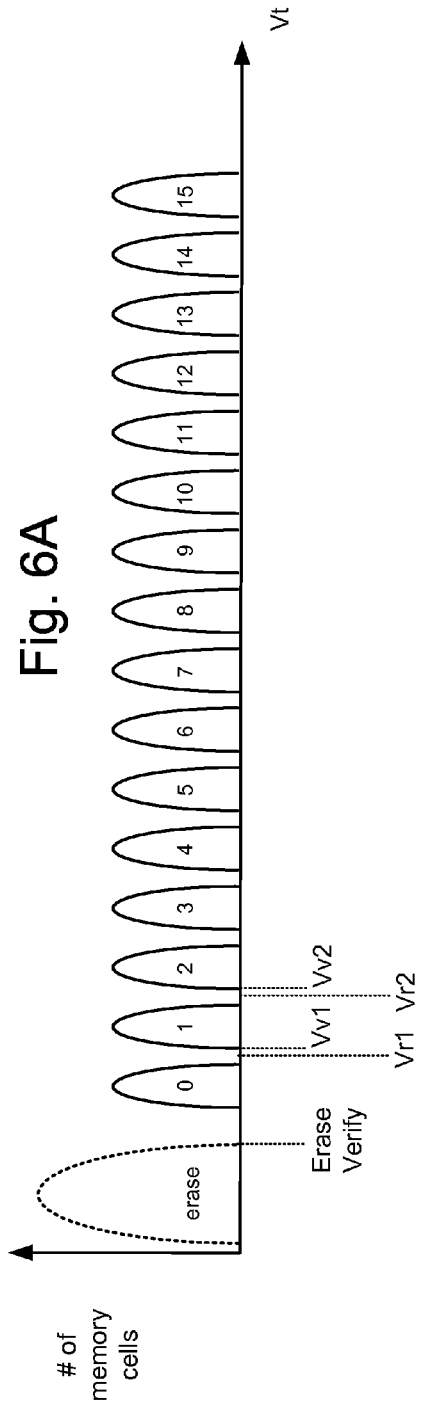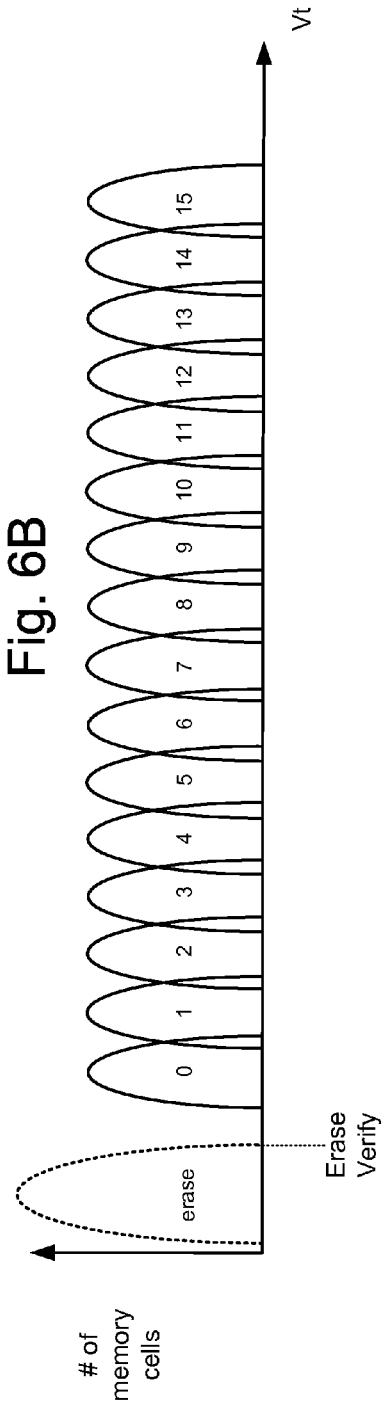

ALL-BIT-LINE ERASE VERIFY AND SOFT PROGRAM VERIFY

PRIORITY DATA

This application is a continuation of U.S. patent application Ser. No. 12/323,413 filed Nov. 25, 2008, entitled "ALL-BIT-LINE ERASE VERIFY AND SOFT PROGRAM VERIFY", which application is incorporated herein by reference in its entirety.

BACKGROUND OF THE INVENTION

1. Field of the Invention

The present invention relates to technology for non-volatile storage.

2. Description of the Related Art

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROMs or flash memory devices have a configuration referred to as a NAND configuration in which memory cells are grouped as NAND strings with each NAND string associated with a bit line. When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory;" all three cited patents are incorporated herein by reference in their entirety.

In many cases, the program voltage is applied to the control gate as a series of pulses (referred to as programming pulses), with the magnitude of the pulses increasing with each pulse. Between programming pulses, a set of one or more verify operations are performed to determine whether the memory cell(s) being programmed have reached their target level. If a memory cell has reached its target level, programming stops for that memory cell. If a memory cell has not reached its target level, programming will continue for that memory cell.

In some implementations, the memory cells are erased prior to programming. Erasing can be performed on the entire memory array, on individual blocks, or another unit of cells. In one implementation, a group of memory cells is erased by raising p-wells of the memory cells to an erase voltage for a sufficient period of time. An erase pulse moves the threshold voltage of the memory cells towards (or beyond) an erase target level, which may be below 0 Volts. In some implementations, after applying the erase pulse, an erase verify operation is performed to determine whether the threshold voltages of the memory cells have at least reached the erase target level. The erase pulse and erase verify are repeated with each loop using a higher amplitude erase pulse until the erase verify passes.

After erasing the memory cells, some memory cells may be over-erased. That is, the threshold voltage of some memory cells is pushed too far past the target level. For example, the threshold voltage is more negative than desired. Furthermore, the range of threshold voltages of the memory cells may be wider than desired, which can negatively impact the quality of later programming. To tighten the erase distribution and combat over-erasing, the memory cells may be "soft programmed," which compacts the threshold voltage distribution by increasing the lowest threshold voltages of erased memory cells while not significantly increasing the highest threshold voltages of erased memory cells. Soft programming may be performed in a similar manner as the previously described programming, but uses programming pulses with lower voltage magnitudes than regular programming. In one implementation, the soft programming is performed in loops in which each successively higher amplitude soft program pulse is followed by a soft program verify operation.

The processes of verifying the erase and performing soft programming have drawbacks including the amount of time taken and power consumed. In some cases, the target threshold level that needs to be verified by the erase verify or the soft programming verify is a negative value. In one implementation, negative threshold voltages are sensed by pre-discharging bit lines to ground and then applying a higher than zero voltage (e.g., 2.2V) to the common source line. However, the bodies of the memory cells are kept at ground. This causes current to flow from the source to the bit lines causing the bit lines to charge up towards the source line voltage. When the source-to-body voltage of a transistor is other than zero, the threshold voltage is modified, which is referred to as body effect. Thus, the difference in voltage between the source and the body alters the threshold voltage. Charging of the bit lines stops when at least one of the memory cells in a NAND string shuts off. Based on the voltage on the bit line when the NAND string stopped charging, the threshold voltage of the memory cell that turned off is determined (taking the body effect into account). The foregoing technique is referred to herein as a "source follower" technique. Using the source follower technique, negative threshold voltages approaching −Vdd can be measured. However, it can take considerable time to charge the bit lines due to the capacitance of the bit lines. Thus, a single erase verify or soft program verify can take substantial time, for example, about 100 micro-seconds.

Another technique for sensing a negative threshold voltage in a memory cell is to apply a negative voltage to the control gates of the memory cell. However, generating the necessary negative voltages can be difficult. Moreover, the more negative the voltage to be generated the more difficult it is to generate the control gate voltage.

SUMMARY OF THE INVENTION

Techniques are disclosed herein for verifying that memory cells comply with a target threshold voltage that is negative. The technique can be used for an erase verify or a soft program verify.

In one implementation, one or more erase pulses are applied to a group of non-volatile storage elements. The group of non-volatile storage elements are associated with bit lines and with word lines. One or more non-negative compare voltages (e.g., zero volts) are applied to at least a portion of the word lines after applying the one or more erase pulses. Conditions on the bit lines are sensed while holding differences between voltages on the bit lines substantially constant. The sensing is performed while applying the one or more compare voltages. A determination is made whether the group of non-volatile storage elements are sufficiently erased based on the conditions. At least one additional erase pulse is applied to the group of non-volatile storage elements if the group of non-volatile storage elements are not sufficiently erased.

In the above described process, a negative threshold voltage is verified without applying a negative voltage to the word lines and the verification process is efficient timewise. For example, rather than using a source follower technique that relies on charging (or discharging) a bit line, in one embodiment a sense capacitor is charged (or discharged) based on the current flowing in a bit line. The size of the sense capacitor can be selected to allow much faster charging than the bit lines. Furthermore, no settling of word lines is required because a compare voltage of zero volts may be applied to all word lines. In contrast, some conventional techniques apply a high voltage (e.g., 6V) to unselected word lines, which causes the selected word line voltage to rise due to capacitive coupling to unselected word lines. The selected word line voltage then needs to settle to ground before sensing can begin. In one implementation, an erase pulse is applied to a plurality of non-volatile storage elements, the non-volatile storage elements are connected to a plurality of word lines, the non-volatile storage elements are associated with a plurality of bit lines. A non-negative compare voltage is applied to the word lines after applying the erase pulse. Currents associated with the bit lines are sensed while holding differences between voltages on the bit lines substantially constant. The currents are in response to applying the compare voltage. The sensing of currents is performed while allowing currents of bit lines that have a strong conduction current to contribute to source line bias, which is an apparent increase in threshold voltage that occurs due to current flowing in a common source line having a non-zero resistance to ground. A determination is made whether the non-volatile storage elements are erased to a target threshold voltage that is negative based on the sensed currents. An additional erase pulse is applied to the non-volatile storage elements if the group of non-volatile storage elements are not erased to the target threshold level.

In one embodiment, after erasing the non-volatile storage elements sufficiently to an erased state, at least a portion non-volatile storage elements are programmed to various data states from the erased state. The data states in which the portion of non-volatile memory elements have been programmed is determined as follows. One or more read compare voltages are applied to selected non-volatile memory elements for which a data state is to be determined. A read pass voltage is applied to unselected non-volatile memory elements. Conditions on the bit lines are sensed while holding differences between voltages on the bit lines substantially constant. The sensing is performed while applying the one or more read pass voltages and the read compare voltage.

In one embodiment, the bit lines are charged to a certain voltage prior to sensing the conditions during an erase verify or soft program verify. The certain voltage is greater than a voltage that is applied to the bit lines during either a read operation to determine in which data state a memory cell was previously programmed or a verify operation to determine whether a memory cell currently being programmed has its threshold voltage at a suitable level. Increasing the bit line voltage increases the amount of source line bias, and hence creates an apparent increase in threshold voltage. The apparent increase in threshold voltage allows sensing of more negative threshold voltages without resorting to a source follower technique or to applying negative voltages to word lines.

In one embodiment, the sensing period used during the erase verify sensing operation is reduced compared to the sensing period used during a read operation. The sensing period is a pre-determined time period at the end of which a condition of a bit line is sensed. In one implementation, the sensing period is the length of time that a sense capacitor is either charged or discharged by a bit line current. The length of the sensing period relates to the magnitude of current that is being tested for. For example, if the sense capacitor voltage changes by at least a certain amount by the end of the sensing period, then the bit line has at least the current being tested for. In one implementation, a memory cell is considered to be "on" when the memory cell (as sensed through the bit line) has a certain conduction current. Thus, a pre-determined sensing period may be used to determine whether the memory cell is on. Some embodiments of erase verify use the same sensing period that is used during a read operation to determine whether a memory cell is on. However, other embodiments of erase verify use a shorter sensing period to determine whether the memory cell is on, which corresponds to the memory cell having a greater conduction current to be considered to be on. The net effect is to cause an apparent increase in threshold voltage of the memory cell, which allows sensing of more negative threshold voltages without resorting to a source follower technique or to applying negative voltages to word lines.

One example implementation includes NAND strings of non-volatile storage elements, word lines associated with the non-volatile storage elements, bit lines associated with the NAND strings, and one or more managing circuits in communication with the NAND strings, bit lines, and the word lines. The managing circuit applies one or more erase pulses to the NAND strings as a part of an erase procedure. The managing circuit applies one or more non-negative compare voltages to the word lines after applying the erase pulse. The managing circuit senses conditions on the bit lines while holding differences between voltages on the bit lines substantially constant. The conditions are a result of applying the compare voltage. The managing circuit determines whether the group of non-volatile storage elements are sufficiently erased based on the conditions. The managing circuit applies at least one additional erase pulse to the group of non-volatile storage elements if the group of non-volatile storage elements are not sufficiently erased.

BRIEF DESCRIPTION OF THE DRAWINGS

FIG. 1 is a top view of a NAND string.
FIG. 2 is an equivalent circuit diagram of the NAND string.
FIG. 6A depicts an example set of threshold voltage distributions.

FIG. 6B depicts an example set of threshold voltage distributions.

DETAILED DESCRIPTION

Figure 3:
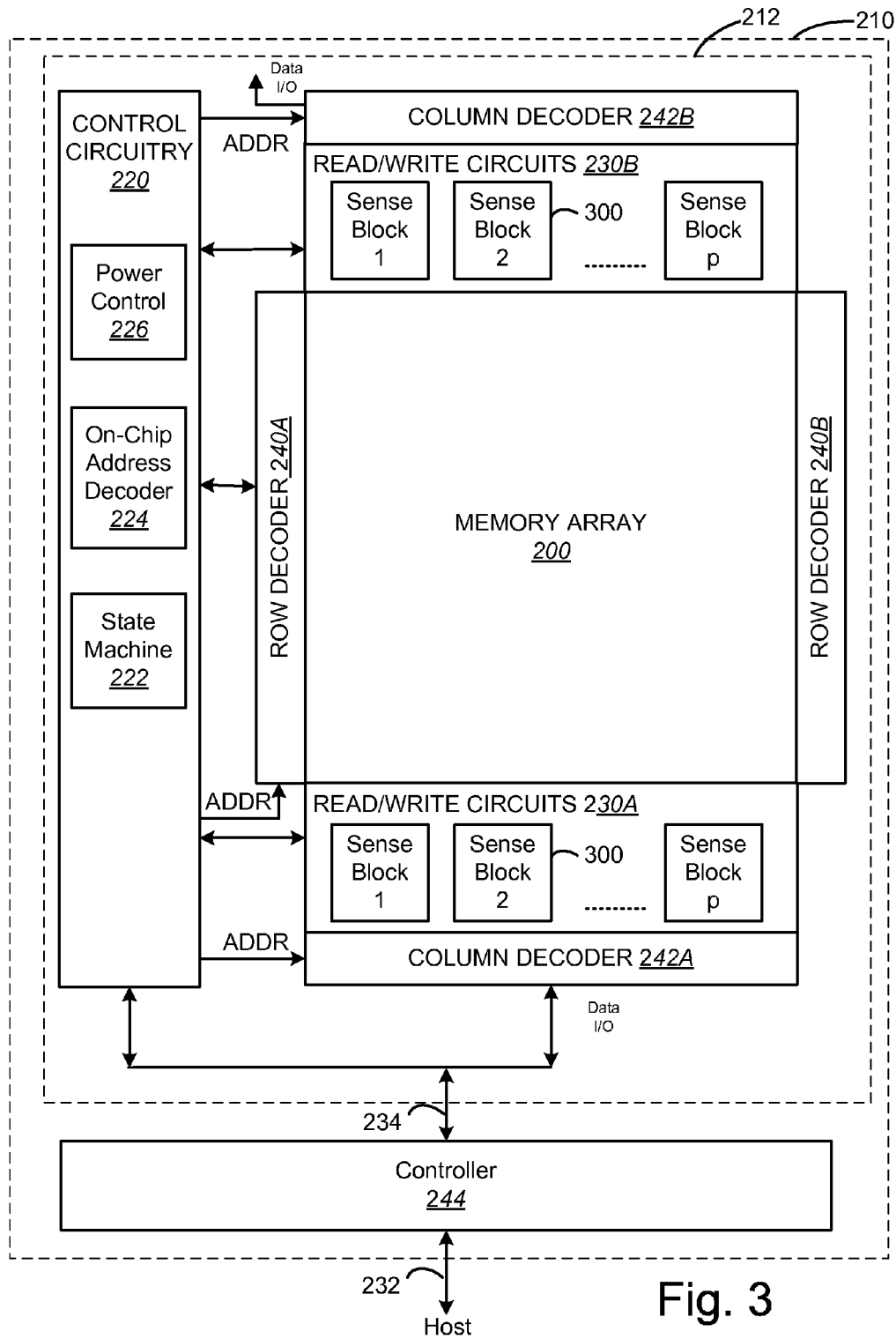
FIG. 3 is a block diagram of a non-volatile memory system.

One example of a non-volatile storage system uses the NAND flash memory structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a non-volatile storage system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Pat. No. 7,237,074, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. No. 6,522,580. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4A:
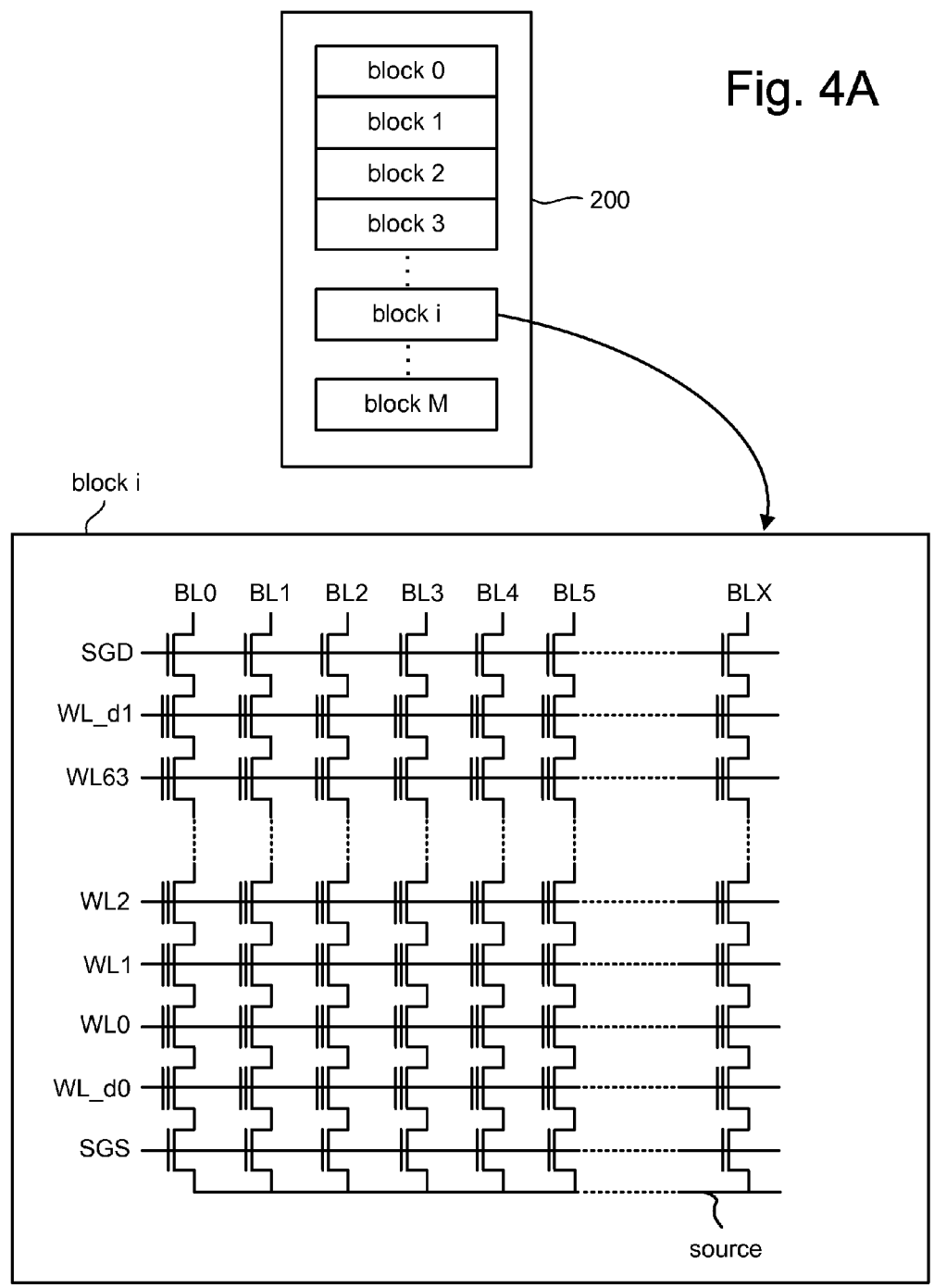
FIG. 4A is a block diagram depicting one embodiment of a memory array.

FIG. 4A depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4A shows more details of block i of memory array 200. Block i includes X+1 bit lines and X+1 NAND strings. Block i also includes 64 data word lines (WL0-WL63), two dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are 64 data word lines and two dummy word lines, each NAND string includes 64 data memory cells and two dummy memory cells. In other embodiments, the NAND strings can have more or fewer than 64 data memory cells and two dummy memory cells. Data memory cells can store user or system data. Dummy memory cells are typically not used to store user or system data. Some embodiments do not include dummy memory cells.

Figure 4B:
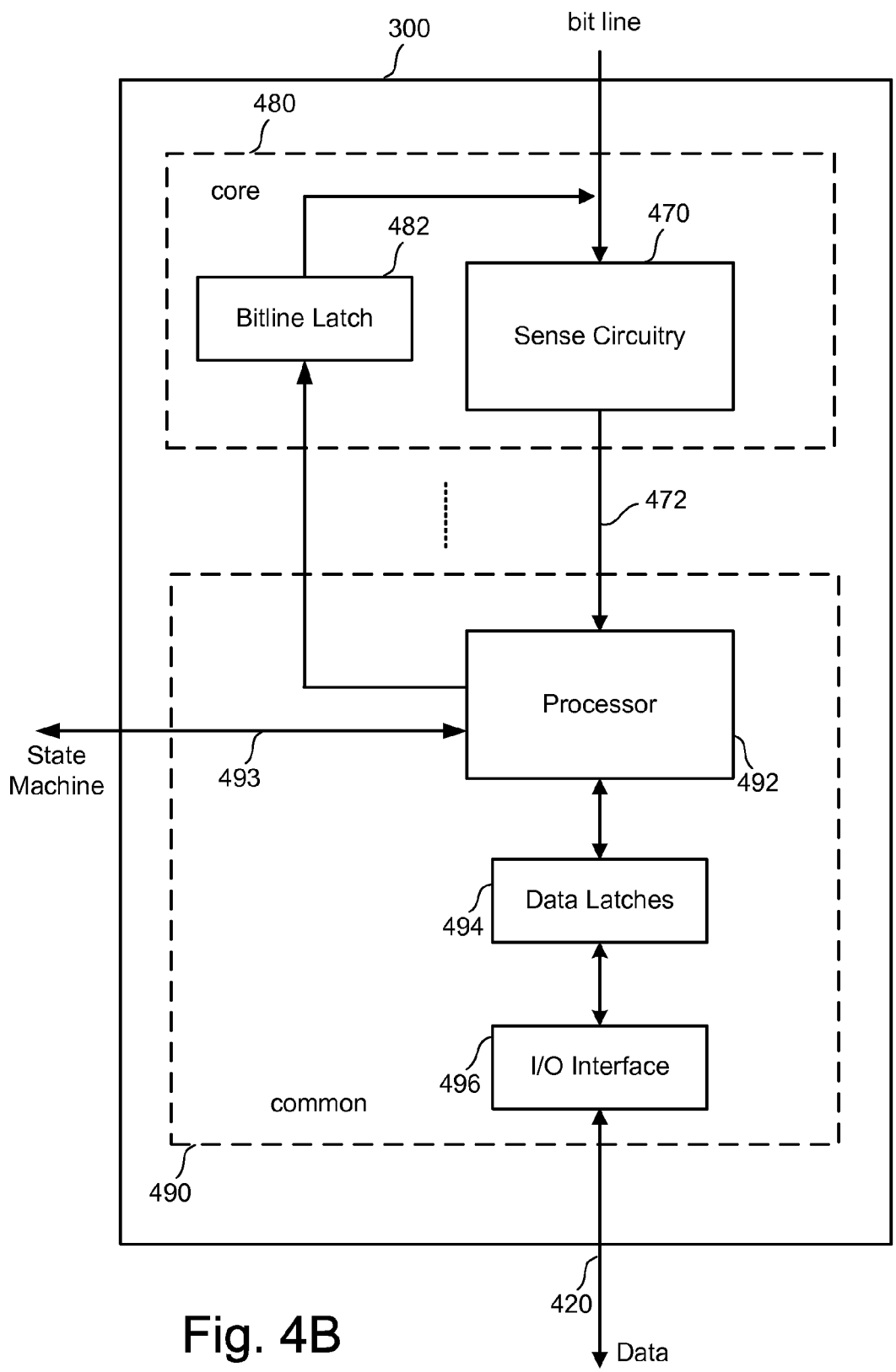
FIG. 4B is a block diagram depicting one embodiment of a sense block.

FIG. 4B is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block 300 will include one common portion 490 and eight sense modules 480. Each of the sense modules 480 in a group will communicate with the associated common portion 490 via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation.

The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4B) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors," (2) U.S. Pat. No. 7,023,736, "Non-Volatile Memory And Method with Improved Sensing"; (3) U.S. Patent Application Pub. No. 2005/0169082; (4) U.S. Pat. No. 7,196,928, "Compensating for Coupling During Read Operations of Non-Volatile Memory"; and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Figure 4C:
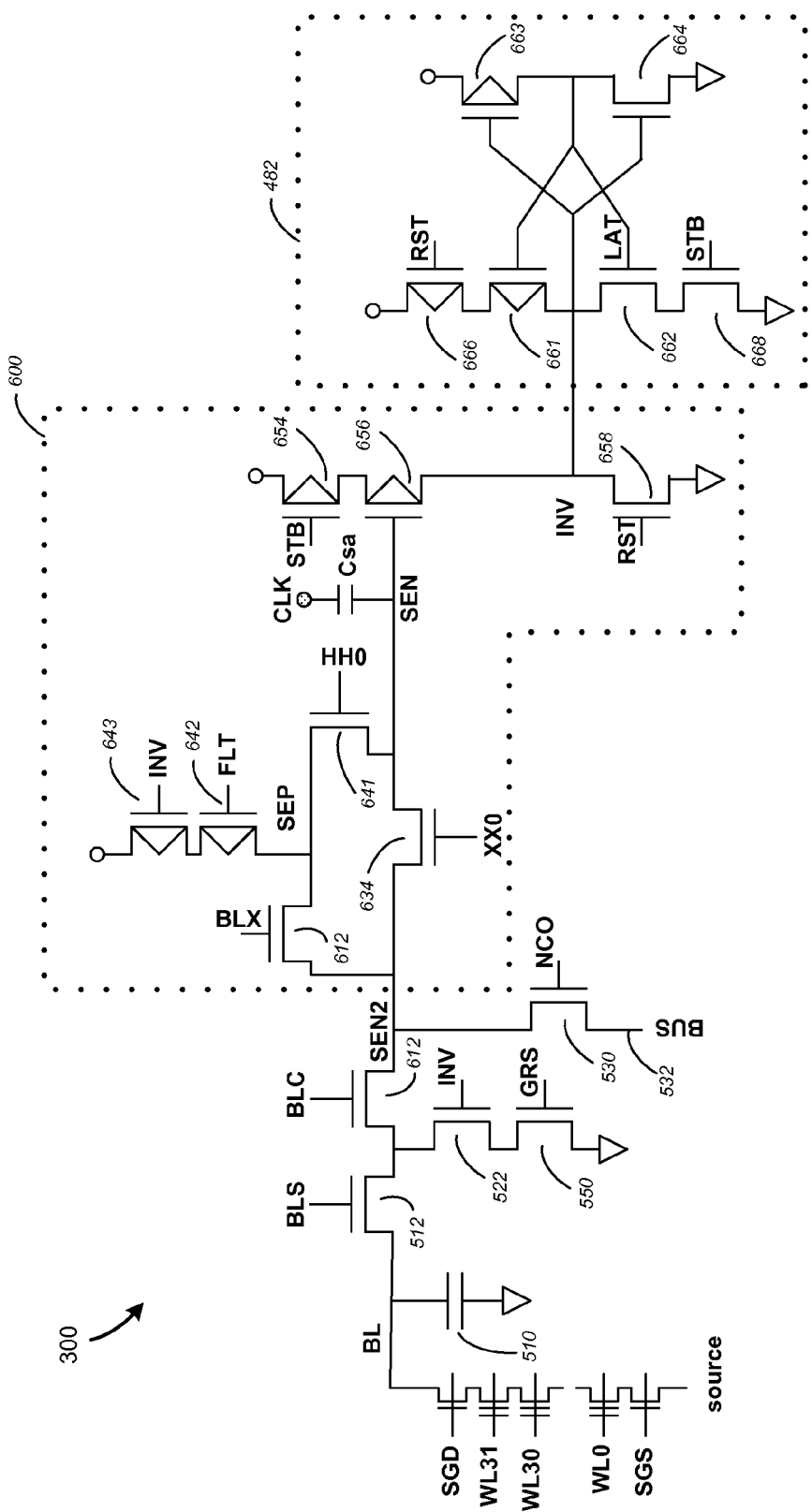
FIG. 4C is a schematic of one embodiment of a sense module.

FIG. 4C illustrates an example of sense module 300; however, other implementations can also be used. The sense module is used when performing all-bit-line (ABL) sensing. In ABL sensing, all of the bit lines are sensed together as opposed to sensing odd and even bit lines separately. In ABL sensing, the difference between voltages on the bit lines is held constant during the sensing. Sense module 300 comprises bit line isolation transistor 512, bit line pull down circuit (transistors 522 and 550), bit line voltage clamp transistor 612, readout bus transfer gate 530, sense amplifier 600 and bit line latch 482. One side of bit line isolation transistor 512 is connected to the bit line BL and capacitor 510. The other side of bit line isolation transistor 512 is connected to bit line voltage clamp transistor 612 and bit line pull down transistor 522. The gate of bit line isolation transistor 512 receives a signal labeled as BLS. The gate of bit line voltage clamp transistor 512 receives a signal labeled as BLC. Bit line voltage clamp transistor 512 is connected to readout bus transfer gate 530 at node SEN2. Readout bus transfer gate 530 is connected to readout bus 532. Bit line voltage clamp transistor 512 connects to sense amplifier 600 at node SEN2. In the embodiment of FIG. 4C, sense amplifier 600 includes transistors 613, 634, 641, 642, 643, 654, 654 and 658, as well as capacitor Csa, Bit line latch 482 includes transistors 661, 662, 663, 664, 666 and 668.

In general, memory cells along a word line are operated on in parallel. Therefore, a corresponding number of sense modules are in operation in parallel. In one embodiment, a controller provides control and timing signals to the sense modules operating in parallel. In some embodiments, data along a word line is divided into multiple pages, and the data is read or programmed a page at a time, or multiple pages at a time.

Sense module 300 is connectable to the bit line (e.g., bit line BL) for a memory cell when the bit line isolation transistor 512 is enabled by signal BLS. Sense module 300 senses the conduction current of the memory cell by means of sense amplifier 600 and latches the read result as a digital voltage level at a sense node SEN2 and outputs it to readout bus 532 via gate 530.

The sense amplifier 600 comprises a second voltage clamp (transistors 612 and 634), a pre-charge circuit (transistors 541, 642 and 643), and a discriminator or compare circuit (transistors 654, 656 and 658; and capacitor Csa). In one embodiment, a reference voltage is applied to the control gate of a memory cell being read. If the reference voltage is high enough relative to the threshold voltage of the memory cell, then the memory cell will turn on and conduct current between its source and drain. If the reference voltage is not sufficiently high relative to the threshold voltage of the memory cell, then the memory cell will not turn on and will not conduct current between its source and drain. In many implementations, the on/off may be a continuous transition so that the memory cell will conduct different currents in response to different control gate voltages. If the memory cell is on and conducting current, the conducted current will cause the voltage on node SEN to decrease, effectively charging or increasing the voltage across capacitor Csa whose other terminal is at Vdd. If the voltage on node SEN discharges to a predetermined level during a predetermined sensing period (integration time), then sense amplifier 600 reports that the memory cell turned on in response to the control gate voltage. In one implementation, different sensing periods are used for operations involving an erased state then for a data state. For example, a shorter sensing period may be used for an erase verify (or soft program verify) than when reading to determine (or verify) a data state of a memory cell. Using a shorter sensing period helps to sense threshold voltages that are more negative than might otherwise be sensed using a longer sensing period.

One feature of the sense module 300 is the incorporation of a constant voltage supply to the bit line during sensing. This is preferably implemented by the bit line voltage clamp transistor 612, which operates like a diode clamp with transistor 612 in series with the bit line BL. Its gate is biased to a constant voltage BLC equal to the desired bit line voltage VBL above its threshold voltage VT. In this way, it isolates the bit line from the node SEN and sets a constant voltage level for the bit line, such as the desired VBL=0.5 to 0.7 volts during program-verifying or reading. In general, the bit line voltage level is set to a level such that it is sufficiently low to avoid a long pre-charge time, yet sufficiently high to avoid ground noise and other factors. In one implementation, the bit lines are charged to different voltages depending on whether the operation involves an erased state or a data states. For example, a greater bit line voltage may be applied for an erase verify (or soft program verify) then for a data state operation.

Sense amplifier 600 senses the conduction current through the sense node SEN and determines whether the conduction current is above or below a predetermined value. The sense amplifier outputs the sensed result in a digital form as the signal SEN2 to readout bus 532.

The digital control signal INV, which can essentially be an inverted state of the signal at SEN2, is also output to control the pull down circuit. When the sensed conduction current is higher than the predetermined value, INV will be HIGH and SEN2 will be LOW. This result is reinforced by the pull down circuit. The pull down circuit includes an n-transistor 522 controlled by the control signal INV and another n-transistor 550 controlled by the control signal GRS. The GRS signal when LOW allows the bit line BL to be floated regardless of the state of the INV signal. During programming, the GRS signal goes HIGH to allow the bit line BL to be pulled to ground and controlled by INV. When the bit line BL is required to be floated, the GRS signal goes LOW. Note that other designs of sense modules, sense amplifiers and latches can also be used.

Read/write circuits 365 operate on a page of memory cells simultaneously. Each sense module 300 in the read/write circuits 365 is coupled to a corresponding cell via a bit line. The conduction current flows from the sense module through the bit line into the drain of the memory cell and out from the source before going through a source line to ground. In an integrated circuit chip, the sources of the cells in a memory array are all tied together as multiple branches of the source line connected to some external ground pad (e.g., Vss pad) of the memory chip. Due to current flowing through the non-zero resistance of the common source line, the threshold voltage of the memory cells may appear to be higher than it actually is. This affect is referred to herein as source line bias.

Figure 10:
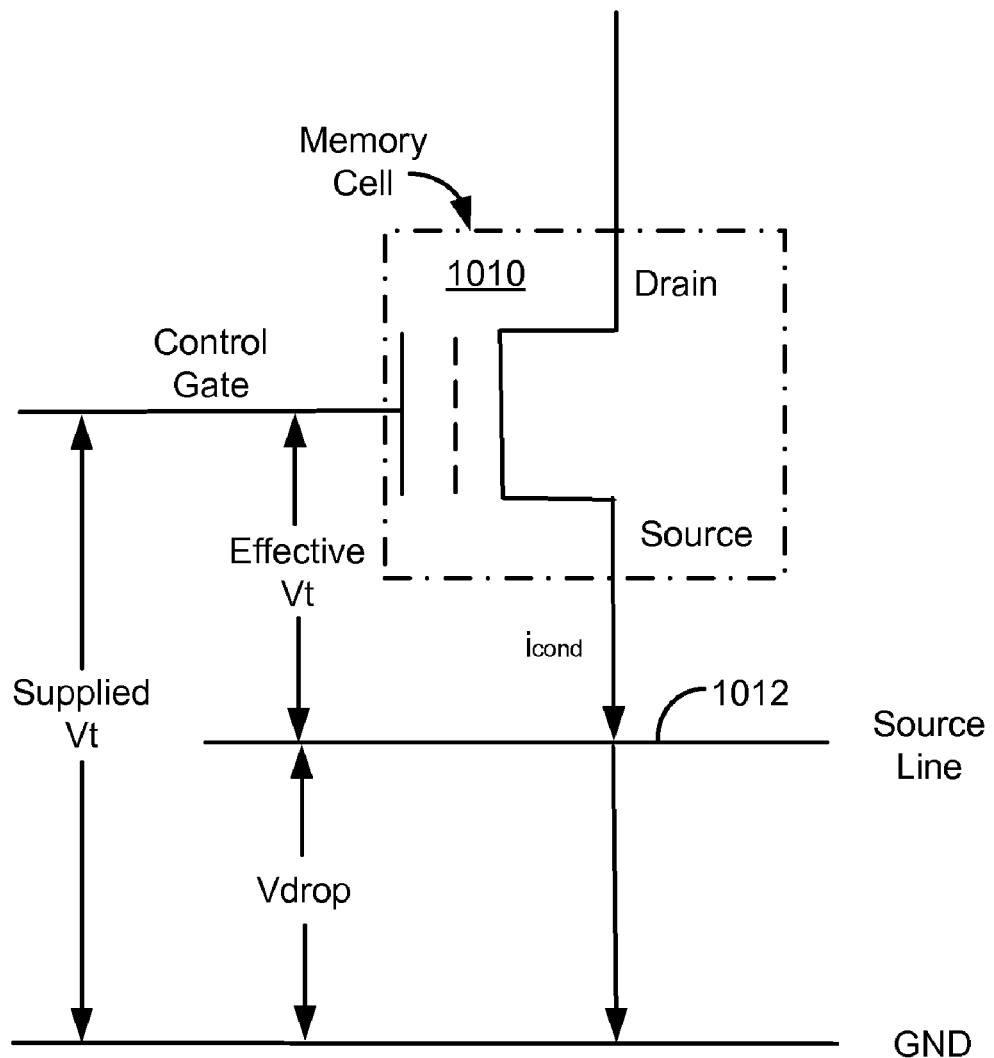
FIG. 10 is a circuit diagram that illustrates how the apparent shift in threshold voltage arises due to source line bias.

FIG. 10 illustrates how an apparent shift in threshold voltage arises due to source line bias. In particular, the apparent shift in threshold voltage arises due to current flow in the source line 1012 having a finite resistance to ground. Note that each sense block 300 in the read/write circuits 230 is coupled to a corresponding memory cell 1010 via a bit line. For example, a sense block 300 senses the conduction current $i_{cond}$ (source-drain current) of a memory cell 1010. The conduction current flows from the sense block 300 through the bit line into the drain of the memory cell 1010 and out from the source of memory cell 1010 before going through a source line 1012 to ground. In one embodiment, the sources of the memory cells in a memory array are all tied together as multiple branches of the source line 1012 connected to some external ground pad (e.g. Vss pad) of the memory chip. Even when metal strappings are used to reduce the resistance of the source line, a finite resistance, R, remains between the source electrode of a memory cell and the ground pad. As an example, the ground loop resistance R could be around 50 ohms.

For a group of memory cells being sensed in parallel, the total current flowing through the source line 1012 is the sum of all the conduction currents, i.e., $I_{Total}=i_{cond1}+i_{cond2}+\ldots i_{condn}$. Generally, each memory cell has a conduction current dependent on the amount of charge programmed into its charge storage element and the voltage applied to the control gate. When a finite resistance (R) exists between the source electrode of a memory cell and the ground pad, the voltage drop ($V_{drop}$) across the resistance is given by $V_{drop}=I_{Total}R$. The magnitude of $V_{drop}$ corresponds to the apparent shift in threshold voltage. Note that tens of thousands of bit lines may discharge at the same time.

When reading to determine a data state of a memory cell, source line bias is reduced by read/write circuits with features and techniques for multi-pass sensing. Each pass helps to identify and shut down the memory cells with conduction currents higher than a given demarcation current value. Typically, with each pass, the given demarcation current value progressively reduces. In this way, sensing in subsequent passes will be less affected by source line bias since the higher current cells have been shut down. In some embodiments, source line bias is not intentionally reduced for operations involving erased states such as an erase verify of soft program verify. This helps to sense more negative threshold voltages.

For example, multi-pass sensing can be implemented in two passes. After the first pass, those memory cells with conduction currents higher than the breakpoint are identified and removed by turning off their conduction current. A preferred way to turn off their conduction currents is to set their drain voltages on their bit lines to ground. In a second pass, error from source line bias is reduced. More than two passes are also contemplated. In embodiments where source line bias will not cause errors, one pass can be used for sensing.

FIGS. 5(A)-5(K) depicts timing diagrams that explain one embodiment of sense module 300 during read/verify operations to determine a data state of memory cells. Note that a different technique is used when performing an erase verify or a soft program verify. Specifically, fewer passes are performed because there is not an attempt to shut down the most strongly conducting memory cells for an erase (or soft program) verify.

Phase (0): Setup

The sense module 300 (see FIG. 4C) is connected to the corresponding bit line via an enabling signal BLS (FIG. 5(A)). The voltage clamp is enabled with BLC (FIG. 5(B)).

Pre-charge transistor 642 is enabled as a limited-current source with a control signal FLT (FIG. 5(C)).

Phase (1): Controlled Pre-Charge

Sense amplifier 600 is initialized by a reset signal RST (FIG. 5(D)) which will pull the signal INV (FIG. 5(H)) to ground via transistor 658. Thus, on reset, INV is set to LOW. At the same time, p-transistor 663 pulls a complementary signal LAT to $V_{dd}$ or HIGH (FIG. 5(H)). That is, LAT is the complement of INV. Isolation transistor 634 is controlled by the signal LAT. Thus, after reset, isolation transistor 634 is enabled to connect sense node SEN2 to the sense amplifier's internal sense node SEN.

Pre-charge transistor 642 pre-charges the bit line BL through the internal sense node SEN and the sense node SEN2 for a predetermined period of time. This will bring the bit line to an optimal voltage for sensing the conduction therein. Pre-charge transistor 642 is controlled by the control signal FLT ("FLOAT"). The bit line will be pulled up towards the desired bit line voltage as set by the bit line voltage clamp 612. The rate of pull-up will depend on the conduction current in the bit line. The smaller the conduction current, the faster the pull-up.

It has been described earlier that sensing errors due to the source line bias are minimized if those memory cells with conduction currents higher than a predetermined value are turned off and their contributions to the source line bias eliminated. Pre-charge transistor 642, therefore, serves two functions. One is to pre-charge the bit line to an optimal sensing voltage. The other is to help identify those memory cells with conduction currents higher than a predetermined value for D.C. (Direct Current) sensing so that they may be eliminated from contributing to source line bias.

The D.C. sensing is accomplished by providing a pre-charge circuit that behaves like a current source for supplying a predetermined current to the bit line. The signal FLT that controls the p-transistor 642 is such that it "programs" a predetermined current to flow. As an example, the FLT signal may be generated from a current mirror with a reference current set to 500 nA. When the p-transistor 642 forms the mirrored leg of the current mirror, it will also have the same 500 nA throwing in it.

Figure 5:
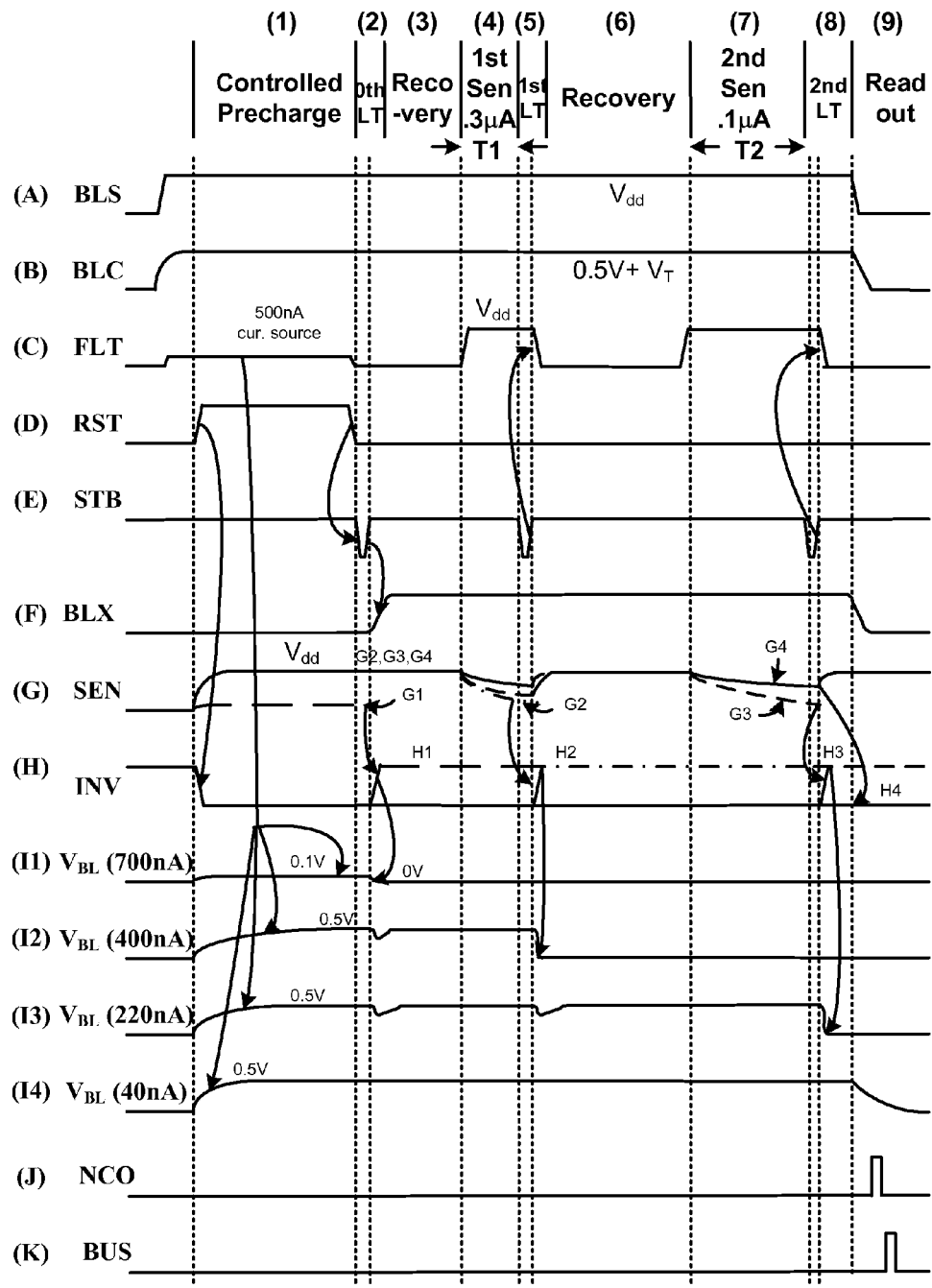
FIG. 5 is a timing diagram for one embodiment of a sense module.

FIGS. 5(I1)-5(I4) illustrate the voltages on four example bit lines connected respectively to memory cells with conduction currents of 700 nA, 400 nA, 220 nA and 40 nA. When a pre-charge circuit (which includes transistor 642) is a current source with a limit of 500 nA, for example, a memory cell having a conduction current exceeding 500 nA will have the charges on the bit line drained faster than it can accumulate. Consequently, for the bit line with conduction current 700 nA, its voltage or the signal at the internal sense node SEN will remain close to 0V (such as 0.1 volt; see FIG. 5(I1)). On the other hand, if the memory cell's conduction current is below 500 nA, the pre-charge circuit (which includes transistor 642) will begin to charge up the bit line and its voltage will begin to rise towards the clamped bit line voltage (e.g., 0.5V set by the voltage clamp 612) (FIGS. 5(I2)-5(I4)). Correspondingly, the internal sense node SEN will either remain close to 0V or be pulled up to Vdd (FIG. 5(G)). Generally, the smaller the conduction current, the faster the bit line voltage will charge up to the clamped bit line voltage. Thus, by examining the voltage on a bit line after the controlled precharge phase, it is possible to identify if the connected memory cell has a conduction current higher or lower than a predetermined level.

Phase (2): D.C. Latching & Removing High Current Cells from Subsequent Strobes

After the controlled pre-charge phase, an initial D.C. high-current sensing phase begins where the node SEN is sensed by the discriminator circuit. The sensing identifies those memory cells with conduction currents higher than the predetermined level. The discriminator circuit includes two p-transistors 654 and 656 in series, which serve as a pull-up for a node registering the signal INV. The p-transistor 654 is enabled by a read strobe signal STB going LOW and the p-transistor 656 is enabled by the signal at the internal sense node SEN going LOW. High current memory cells will have the signal SEN close to 0V or at least unable for its bit lines to be pre-charged sufficiently high to turn off the p-transistor 656. For example, if the weak pull up is limited to a current of 500 nA, it will fail to pull up a cell with conduction current of 700 nA (FIG. 5(G1)). When STB strobes LOW to latch, INV is pulled up to $V_{dd}$. This will set the latch circuit 660 with INV HIGH and LAT LOW (FIG. 5(H1)).

When INV is HIGH and LAT LOW, the isolation gate 630 is disabled and the sense node SEN2 is blocked from the internal sense node SEN. At the same time, the bit line is pulled to ground by the pull down transistor 522 (FIGS. 4C & 5(I1)). This will effectively turn off any conduction current in the bit line, eliminating it from contributing to source line bias.

Thus, in one preferred implementation of the sense module 300, a limited-current source pre-charge circuit is employed. This provides an additional or alternative way (D.C. sensing) to identify bit lines carrying high currents and to turn them off to minimize source line bias error in subsequent sensing.

In another embodiment, the pre-charge circuit is not specifically configured to help identify high current bit lines but is optimized to pull up and pre-charge the bit line as fast as possible within the allowance of the maximum current available to the memory system.

Phase (3): Recovery/Pre-Charge

Prior to sensing of the conduction current in a bit line that has not been previously pulled down, the pre-charge circuit is activated by the signal FLT going LOW to pre-charge the internal sense node SEN2 to $V_{dd}$ (FIG. 5(C) and FIGS. 5(I2)-5(I4)) and the bit line which may have been partially coupled down due to a decrease in the voltage on adjacent bit lines.

Phase (4): First A.C. Sensing

In one embodiment, an A.C. (Alternating Current or transient) sensing is performed by determining the voltage drop at the floated internal sense node SEN. This is accomplished by the discriminator circuit employing the capacitor Csa coupled to the internal sense node SEN, and considering the rate the conduction current is charging it (reducing the voltage on node SEN). In an integrated circuit environment, the capacitor Csa is typically implemented with a transistor; however, other implementations are suitable. Capacitor Csa has a predetermined capacitance, e.g., 30 fF, which can be selected for optimal current determination. The demarcation current value, typically in the range of 100-1000 nA, can be set by appropriate adjustment of the sensing period.

The discriminator circuit senses the signal SEN in the internal sense node SEN. Prior to each sensing, the signal at the internal sense node SEN is pulled up to $V_{dd}$ by pre-charge transistor 642. This will initially set the voltage across the capacitor Csa to be zero.

When the sense amplifier 600 is ready to sense, the pre-charge circuit is disabled by FLT going HIGH (FIG. 5(C)). The first sensing period T1 is ended by the assertion of the strobe signal STB. During the sensing period, a conduction current induced by a conducting memory cell will charge the capacitor. The voltage at SEN will decrease from $V_{dd}$ as the capacitor Csa is charged through the draining action of the conduction current in the bit line. FIG. 5(G) (see curves G2-G4) illustrates the SEN node corresponding to the remaining three example bit lines connected respectively to memory cells with conduction currents of 400 nA, 220 nA and 40 nA, the decrease being more rapid for those with a higher conduction current.

Phase (5): First A.C. Latching and Removal of Higher Current Cells from Subsequent Sensing At the end of the first predetermined sensing period, the SEN node will have decreased to some voltage depending on the conduction current in the bit line (see curves G2-G4 of FIG. 5G). As an example, the demarcation current in this first phase is set to be at 300 nA. The capacitor Csa, the sensing period T1 and the threshold voltage of the p-transistor 656 are such that the signal at SEN corresponding to a conduction current higher than the demarcation current (e.g., 300 nA) will drop sufficiently low to turn on the transistor 656. When latching signal STB strobes LOW, the output signal INV will be pulled HIGH, and will be latched by the latch 482 (FIG. 5(E) and FIG. 5(H) (curve H2)). On the other hand, the signal SEN corresponding to a conduction current below the demarcation current will produce a signal SEN unable to turn on the transistor 656. In this case, the latch 482 will remain unchanged, in which case LAT remains HIGH (FIGS. 5(H3) and 5(H4)). Thus, it can be seen that the discriminator circuit effectively determines the magnitude of the conduction current in the bit line relative to a reference current set by the sensing period.

Sense amplifier 600 also includes the second voltage clamp transistor 612 whose purpose is to maintain the voltage of the drain of the transistor 612 sufficiently high in order for the bit line voltage clamp 610 to function properly. As described earlier, the bit line voltage clamp 610 clamps the bit line voltage to a predetermined value $V_{BL}$, e.g., 0.5V. This will require the gate voltage BLC of the transistor 612 to be set at $V_{BL}+V_T$ (where $V_T$ is the threshold voltage of the transistor 612) and the drain connected to the sense node 501 to be greater than the source, i.e., the signal SEN2>$V_{BL}$. In particular, given the configurations of the voltage clamps, SEN2 should be no higher than the smaller of XXO-$V_T$ or BLX-$V_T$, and SEN should be no lower. During sensing, the isolation gate 630 is in a pass-through mode. However, during sensing the signal at the internal sense node SEN has a voltage that decreases from $V_{dd}$. The second voltage clamp prevents SEN from dropping below XXO-$V_T$ or BLX-$V_T$, whichever is lower. This is accomplished by an n-transistor 612 controlled by a signal BLX, where BLX is $\geq V_{BL}+V_T$. Thus, through the actions of the voltage clamps, the bit line voltage $V_{BL}$ is kept constant, e.g., ~0.5V, during sensing.

The output of the current determination is latched by the latch circuit 482. The latch circuit is formed as a Set/Reset latch by the transistors 661, 662, 663 and 664 together with the transistors 666 and 668. The p-transistor 666 is controlled by the signal RST (RESET) and the n-transistor 668 is controlled by the signal STB. A variation of the above-described sense amplifier that is adapted for low voltage operation is found in U.S. Pat. No. 7,046,568 titled "Improved Memory Sensing Circuit And Method For Low Voltage Operation," Inventor Raul-Adrian Cernea, incorporated herein by reference in its entirety.

In general, there will be a page of memory cells being operated on by a corresponding number of multi-pass sense modules 300. For those memory cells having conduction current higher than the first demarcation current level, their LAT signal will be latched LOW (INV latched HIGH). This in turn activates the bit line pull down circuit 520 to pull the corresponding bit lines to ground, thereby turning off their currents.

Phase (6): Recovery/Pre-Charge

Prior to the next sensing of the conduction current in a bit line that has not been previously pulled down, the pre-charge circuit is activated by the signal FLT to pre-charge the internal sense node 631 to $V_{dd}$ (FIG. 5(C) and FIGS. 5(I3)-5(I4)).

Phase (7): Second Sensing

When the sense amplifier 600 is ready to sense, the pre-charge circuit is disabled by FLT going HIGH (FIG. 5(C)). The second sensing period T2 is set by the assertion of the strobe signal STB. During the sensing period, a conduction current, if any, will charge the capacitor. The signal at the node SEN will decrease from $V_{dd}$ as capacitor Csa is charging through the draining action of the conduction current in the bit line 36.

In accordance with the example before, the memory cells with conduction currents higher than 300 nA have already been identified and shut down in the earlier phases. FIG. 5(I) (curves I3 and I4) illustrate respectively the SEN signal corresponding to the two example bit lines connected respectively to memory cells with conduction currents of 220 nA and 40 nA.

Phase (8): Second Latching for Reading Out

At the end of the second predetermined sensing period T2, SEN will have decreased to some voltage depending on the conduction current in the bit line (FIG. 5(I) (curves I3 and I4)). As an example, the demarcation current in this second phase is set to be at 100 nA. In this case, the memory cell with the conduction current 220 nA will have its INV latched HIGH (FIG. 5(H)) and its bit line subsequently pulled to ground (FIG. 5(I3)). On the other hand, the memory cell with the conduction current 40 nA will have no effect on the state of the latch, which was preset with LAT HIGH.

Phase (9): Read Out to the Bus

Finally, in the read out phase, the control signal NCO at the transfer gate 530 allows the latched signal SEN2 to be read out to the readout bus 532 (FIGS. 5(J) and 5(K)).

As can be seen from FIGS. 5(I1)-5(I4), the bit line voltage remains constant during each sensing period. Thus, from the discussion earlier, capacitive bit-line to bit-line coupling is eliminated.

The sense module 300 described above is one embodiment where sensing is performed with three passes, the first two passes being implemented to identify and shut down higher current memory cells. With the higher current contributions to the source line bias eliminated, the final pass is able to sense the cells with lower range conduction currents more accurately.

In other embodiments, sensing operations are implemented with different combination of D.C. and A.C. passes, some using only two or more A.C. passes. For the different passes, the demarcation current value used may be the same each time or converge progressively towards the demarcation current used in the final pass. Additionally, the sensing embodiment described above is just one example of a suitable sense module. Other designs and technologies can also be used to implement the invention described herein. No one particular sense module is required or suggested for the invention described herein.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example threshold voltage distributions corresponding to 16 data states (0-15) for the memory cell array when each memory cell stores four bits of data. Other embodiment, however, may use more or fewer than four bits of data per memory cell. FIG. 6A shows 16 threshold voltage distributions corresponding to data states 0-15. In one embodiment, the threshold voltages in some of the states (e.g., 0-3) are negative and the threshold voltages in the states 4-15 are positive. However, the threshold voltages in more or fewer states may be negative. An erase threshold distribution is also shown in dotted lines to indicate an example erase distribution prior to programming the memory cells to the different data states. In this example, the erase distribution is a distinct state from the data states. However, in some embodiments, the erase distribution can be used as one of the data states. For example, the erase distribution can be used as the lowest data state.

Between each of the data states 0-15 are read reference voltages used for reading data from memory cells. For example, FIG. 6A shows read reference voltage Vr1 between data states 0 and 1, and Vr2 between data states 1 and 2. By testing whether the threshold voltage of a given memory cell is above or below the respective read reference voltages, the system can determine what state the memory cell is in.

At or near the lower edge of each data state 0-15 are verify reference voltages. For example, FIG. 6A shows Vv1 for state 1 and Vv2 for state 2. When programming memory cells to a given state, the system will test whether those memory cells have a threshold voltage greater than or equal to the verify reference voltage.

Also depicted is an erase verify voltage at the upper end of the erase distribution. When erasing a group of memory cells, the system will test whether any NAND strings of memory cells have at least one memory cell with a threshold voltage greater than the erase verify voltage. If more than a certain number of NAND strings have at least one memory cell with a threshold voltage above the erase verify voltage, then another erase pulse is applied to the group to push the threshold voltages to a more negative value. In one implementation, when soft programming memory cells after an erase, the erase verify voltage is used a soft programming target. Specifically, a determination is made as to whether memory cells have their threshold voltage pushed above the erase verify voltage as a result of soft programming. If too many cells have been soft programmed above the erase verify voltage, then soft programming stops.

Herein, an operation involving an erased state such as an erase verify or soft program verify is referred to as an erase state operation. On the other hand, an operation involving a data state such as determining which state (0-15) the memory cell was previously programmed to or performing a read verify during programming is referred to as a data state operation.

FIG. 6B illustrates that another embodiment of threshold voltage distributions corresponding to data states 0-15 can partially overlap since the correction algorithm can handle a certain percentage of cells that are in error. A point to note is that contrary to the equal spacing/width of the depicted sixteen states, various states may have different widths/spacings in order to accommodate varying amounts of susceptibility to data retention loss. In some embodiments, states 0 and/or 15 are wider than the other states.

Also note that the threshold voltage axis may be offset from actual voltages applied to the control gates as embodiments disclosed herein can be used to shift negative threshold voltages into the measurable positive range. Also note that techniques are disclosed herein for efficiently performing an erase verify (or soft program verify).

Figure 7A:
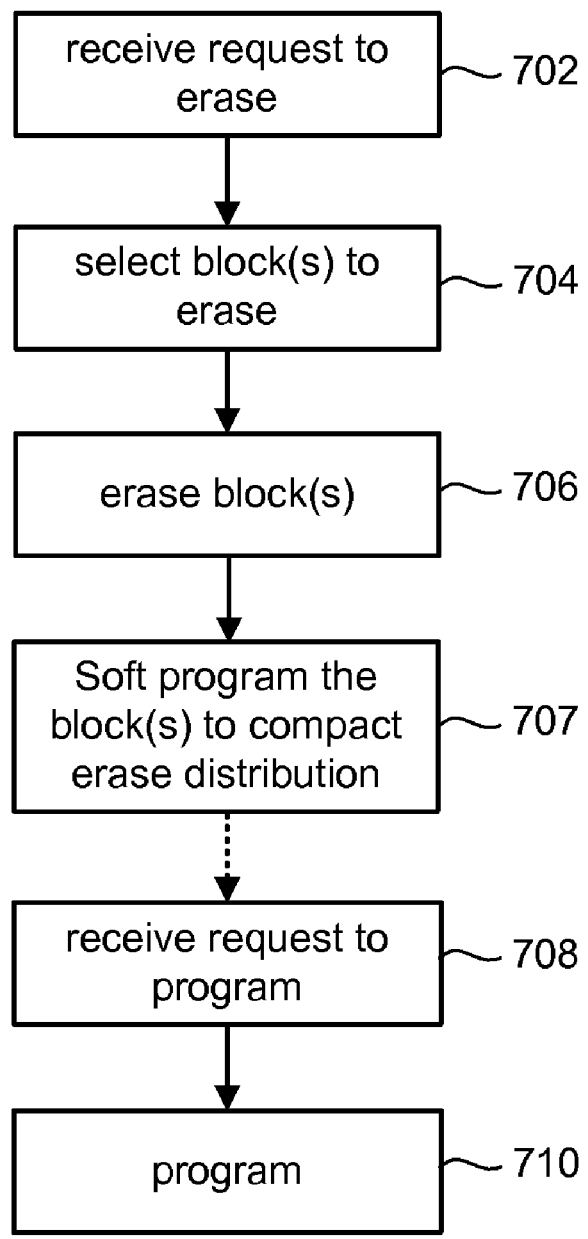
FIG. 7A is a flow chart describing one embodiment of a process for erasing and programming memory cells.

FIG. 7A is a flow chart describing one embodiment of a process for erasing and programming memory cells. The process of FIG. 7A is performed by the one or more managing circuits described above. In step 702, the system will receive a request to erase data. In one embodiment, it is possible that there will not be a dedicated erase command. Rather, the system will erase (prior to programming) in response to a request to program. In step 704, the blocks to be erased are selected.

In step 706, the memory cells are erased. After a block of memory cells is erased, the various memory cells can be programmed or partially programmed. Note that the erasing that is performed in step 706 would not need to be performed before each word line of a block is programmed. Rather, the block can be erased and then each word line can be programmed without erasing between the programming of the word lines.

In step 707, soft programming may optionally be performed to compact the threshold voltage distribution of the erased memory cells. Some memory cells may be in a deeper erased state than necessary as a result of the erase. Soft programming is a technique that applies small programming pulses to compact the erase distribution by moving the threshold voltage of the more deeply erased memory cells closer to the erase target verify level. Often times, cells that are erased to unusually deep negative threshold voltages are cells that have unusually high coupling ratios. During soft programming these cells are going to be soft programmed harder than the typical cells. The net result of following erase with even a single soft program pulse is then a tightening of the erase distribution.

In step 708 of FIG. 7A, the system will receive a request to program data. A dotted line is depicted to connect step 707 to step 708 because there could possibly be a long time lapse between steps 707 and 708. In step 710, the memory cells will be programmed. The memory cells can be programmed in step 710 according to many of various programming methods known in the art.

Figure 7B:
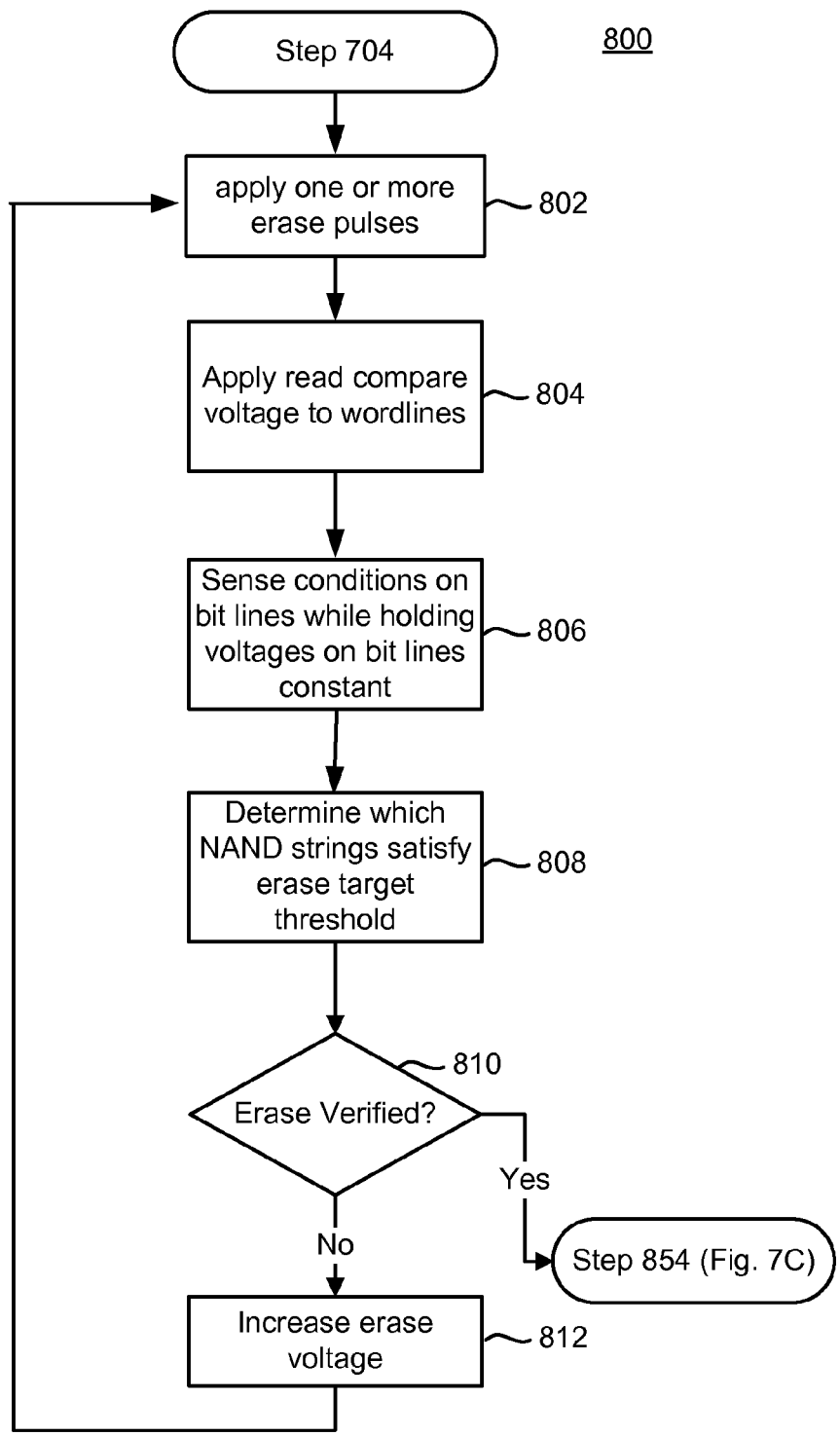
FIG. 7B depicts one embodiment of erasing memory cells.

FIG. 7B depicts one embodiment of a process 800 of erasing memory cells. In one embodiment, process 800 is used to implement step 706 of FIG. 7A. Process 800 includes verifying that the memory cells have been erased to a target threshold voltage using "all-bit-line" (ABL) sensing. In ABL sensing, all of the bit lines are sensed together as opposed to sensing odd and even bit lines separately. In ABL sensing, the difference between voltages on the bit lines is held constant during the sensing. In one implementation, the difference between the bit line voltages is kept constant by holding the voltage on each bit line constant.

In step 802, one or more erase pulses are applied to the memory cells to be erased. In one implementation, a group of memory cells is erased by raising p-wells of the memory cells to an erase voltage (e.g., 20 volts) for a sufficient period of time and grounding the word lines of a selected block while the source and bit lines are floating. In blocks that are not selected to be erased, word lines (unselected) are floated. Due to capacitive coupling, the unselected word lines, bit lines, select lines, and the common source line are raised to a significant fraction of the erase voltage. In blocks that are selected to be erased, a strong electric field is thus applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. The following discussion will assume that a block of memory cells is being erased. However, erasing can be performed on the entire memory array, on individual blocks, or another unit of cells.

Figure 8:
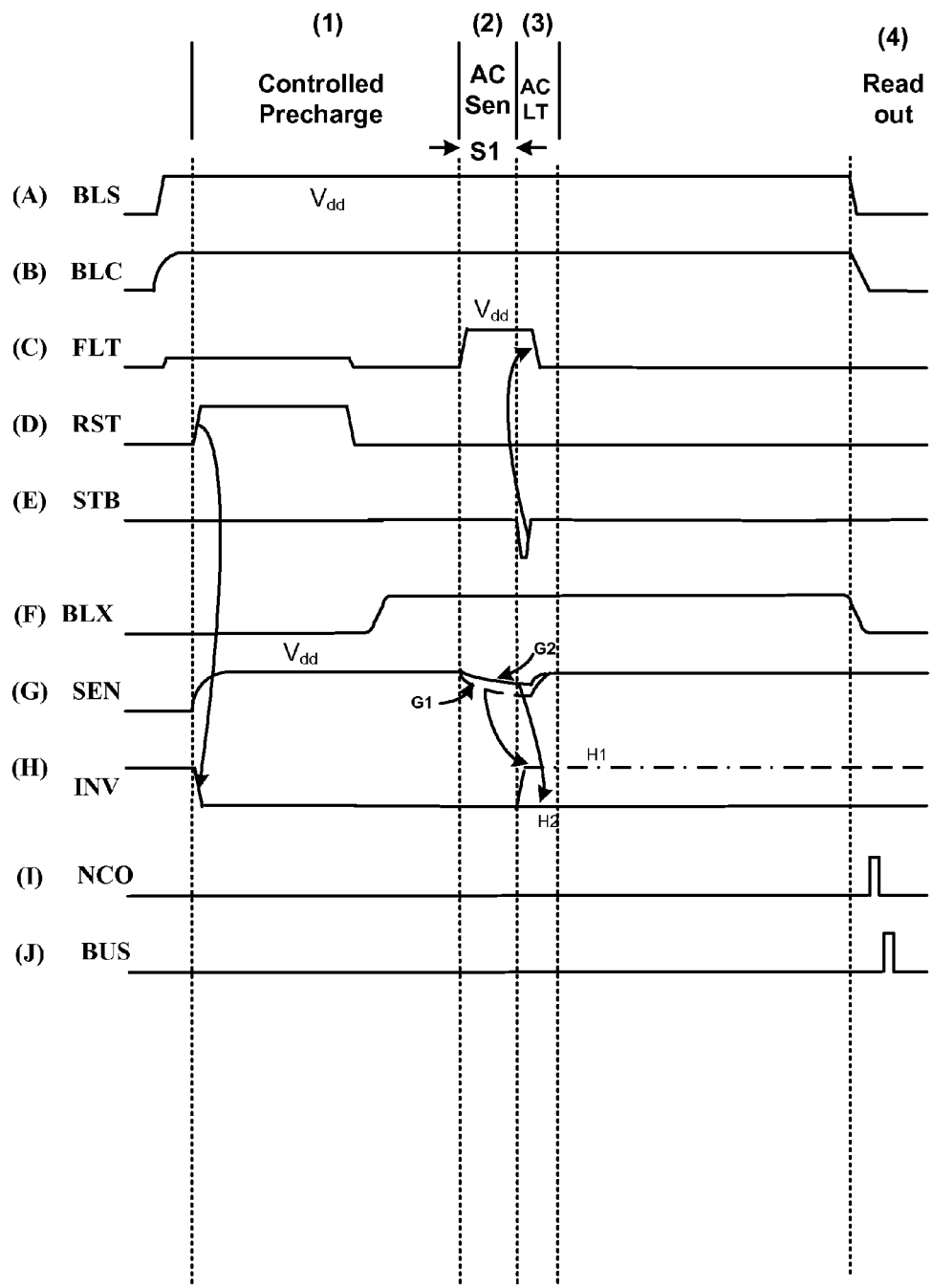
FIG. 8 is a timing diagram for one embodiment of a sense module.

Note that step 802 may be performed again after step 812, in which case a different number of erase pulses may be applied. For example, initially several erase pulses might be applied prior to going on to step 804. However, after the process has gone through one cycle and returns to step 802, fewer erase pulses (e.g., one pulse) might be applied. That is, when the memory cells get closer to the target erase level, fewer erase pulses might be used. However, this is just an example, and the process of FIG. 8 is not limited to this example.

After applying the one or more erase pulses, a determination is made as to whether enough memory cells have been erased to a target threshold voltage, which is a negative value for an erase verify. In some implementations, the target value is as low as −3V. Note that some memory cells will be erased to a much lower value. For example, the erase distribution may range from about −3V to −6V. However, note that as discussed further below, it may not be necessary to erase as deeply as −3V. In one implementation, the erase verification is on a NAND string basis. That is, each NAND string is characterized based on its memory cell with the highest threshold voltage.

In step 804, a non-negative compare voltage is applied to word lines in the block (or other unit) for which the erase is to be verified. Referring back to FIG. 4A, a block may have data word lines (e.g., WL0-WL63) and one or more dummy word lines (e.g., WL_d0 and WL_dt). In one embodiment, the compare voltage is applied to one or more of the dummy word lines. In one embodiment, the non-negative compare voltage is zero volts. In one embodiment, the compare voltage is applied to all of the data word lines, but not the dummy word lines. Instead, a higher voltage than the compare voltage is applied to the dummy word lines so as to avoid erasing data word line memory cells any harder than necessary when dummy word line cells are found to be harder to erase than data word line cells. However, the voltage applied to the dummy word lines should not be too high (e.g., 1V may be a good value) for the following reasons.

One reason why deep erase levels may be considered to be desirable is due to the floating gate to floating gate coupling effect (or simply "FG-FG coupling") which can be experienced by an erased cell that has all of its eight neighbors subsequently programmed to either high threshold voltage states or the highest threshold voltage state. Briefly, in one implementation, the total FG-FG coupling effect that might be experienced by an erased memory cell that remains erased and has all its eights neighbors go to the highest threshold voltage state is 890 mV. The FG-FG coupling effect is described more fully below.

Figure 11A:
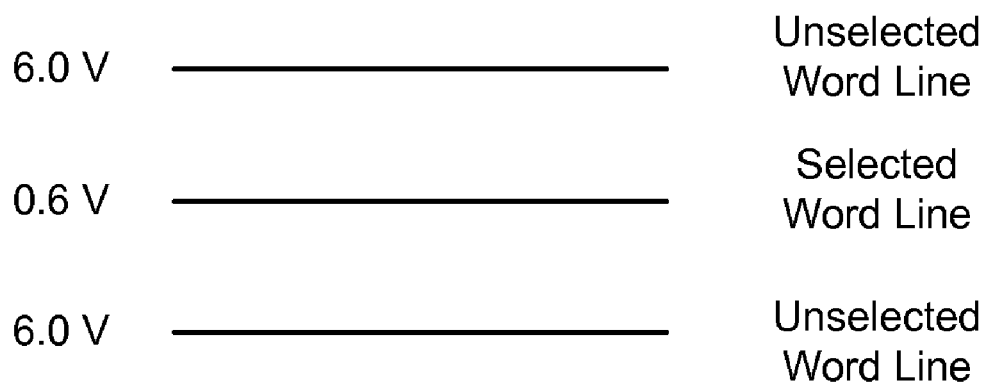
FIG. 11A and FIG. 11B depict voltages applied to selected and unselected word lines when reading to determine the point threshold voltage distributions.
Figure 11B:
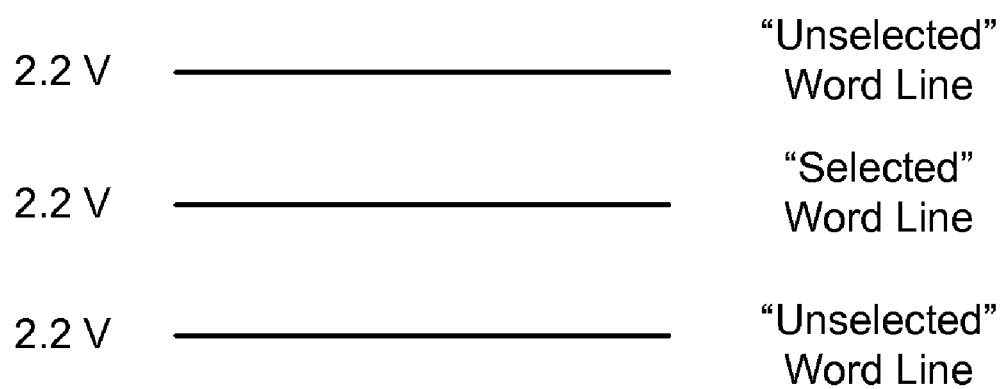

However, another effect is the difference in control gate voltage applied during erase verify operations and read operations. During a read operation, every memory cell that is a selected cell for a read operation has six neighbor cells residing on neighbor word lines (three on the word line above and three on the word line below). The control gate voltages for the neighbors during a read operation is Vread (e.g., 6.0V). However, during erase verify, the control gate voltage on the six neighbor cells may be 0V. This difference in control gate voltage allows the memory cells to be erased less deeply, since the change in Vread between erase verify and read operations more than compensates for all eight neighbors' FG to FG coupling effects. Therefore, no additional erase verify depth has to be provided to counteract FG to FG coupling effects. However, if a dummy word line has a substantially higher than zero voltage applied to it during erase verify operations, then its neighbor memory cells are not benefiting as much from the aforementioned change in neighbor control gate voltage. Thus, to take advantage of this affect, the voltage applied to the dummy word line during erase verify operations should not be too high. The discussion of FIGS. 11A and 11B provides further details of this effect.

Note that if zero volts is applied to all word lines in step 804, no time needs to be spent in raising unselected word lines to a high voltage such as Vread (e.g., 6.0 V). Applying Vread to a word line causes all memory cells on that word lines to conduct a current. Further note that if Vread (e.g., 6 V) is applied to unselected word lines, then the selected word line's voltage would rise due to capacitive coupling with its neighbors. Then, time would be needed to allow the selected word line voltage to settle back down to ground. However, using the technique of step 804, no extra time is spent in bringing down the selected word line back to ground. That is, during the erase verify all word lines may start at 0 V and remain at 0 V, therefore eliminating the need for any word line settling times. In one implementation a single erase verify operation can be completed in about 10 microseconds. In contrast, a single source follower erase verify may take 80 microseconds.

In step 806, conditions are sensed on the bit lines in the block while holding the difference between voltages on the bit lines constant. This sensing technique results in sensing all bit lines in parallel while minimizing errors caused by bit-line to bit-line coupling. Essentially, the bit line voltages are controlled such that the voltage difference between each adjacent pair of bit lines is held constant while their conduction currents are being sensed. When this condition is imposed, there will be no currents due to the various bit line capacitances since those capacitive currents depend on a time varying voltage difference between bit lines.

The following are details of sensing the bit lines. Each bit line is charged to a bit line voltage within a predetermined voltage range. As an example, each bit line is charged to 0.5 V. The bit line voltage of each bit line is controlled such that the voltage difference, if any, between each adjacent pair of bit lines is held constant during sensing of the bit lines. While the bit lines are under control, the conduction current through each bit line is sensed. Note that it is not a requirement that each bit line have the same voltage. For example, it may be that some of the bit lines may not charge all the way to 0.5V. However, so long as the voltage difference between each bit line and its neighbors is held constant during sensing, there will be no undesired current due to the capacitive coupling of the bit lines.

In one embodiment, a determination of the memory cell's conduction current is made by noting the rate of voltage change of a "sense" capacitor. For example, while the bit line voltages are under control, the conduction current through each bit line is sensed by using the conduction current to change the voltage across the sense capacitor. The conduction current is determined by the rate of change in the sense capacitor voltage. One technique for determining the rate of sense capacitor voltage change is to allow the conduction current to change the capacitor voltage for a pre-determined integration period. Then, a determination is made as to whether the sense capacitor voltage changed more or less than a predetermined amount over the pre-determined integration period. The answer determines if the cell is detected to be on or off. Additional details can be found in U.S. Pat. No. 7,196,131; U.S. Pat. No. 7,023,736; U.S. Pat. No. 7,196,928; U.S. Patent Application Pub. No. 2005/0169082; and United States Patent Application Pub. No. 2006/0158947.

Measuring current using a dedicated capacitor instead of using the bit line capacitance is advantageous in several respects. First, it allows a constant voltage source on the bit line thereby avoiding bit-line to bit-line crosstalk. Secondly, the dedicated sense capacitor allows a capacitance to be selected that is optimal for sensing. Note that the sense capacitor may have a capacitance that is much smaller than the capacitance of the bit lines. For example, the sense capacitor may have a capacitance of about 30 fF as compared to a bit line capacitance of about 2 pF. A smaller capacitance can increase the sensing speed since it charges/discharges faster. Further, sensing relative to a dedicated capacitance as compared to using the capacitance of the bit line allows the sensing circuits to be independent of the memory architecture.

Note that using a sense capacitor is not a requirement. In one embodiment, the bit line current determination is accomplished by comparison with a reference current, which may be provided by the conduction current of a reference memory cell.

Because the same compare voltage is applied to each word line in step 804, the sensing is being performed on a NAND string basis. In step 808, a determination is made as to which NAND strings satisfy the erase target threshold. That is, a determination is made as to which NAND strings are sufficiently erased. In one embodiment, if it is detected that the threshold voltage of each memory cell on a NAND string has reached the target level, then the data stored in the corresponding data latch is changed to a logic "1" to indicate the NAND string is sufficiently erased. If it is detected that the NAND string has at least one memory cell with a threshold voltage that has not reached the appropriate target level, the data stored in the corresponding data latch is not changed.

In step 810, a determination is made as to whether enough NAND strings passed erase verification. In one implementation, a certain number of NAND strings are allowed to have one or more memory cells with a threshold voltage that does not satisfy the target threshold voltage. For example, providing that fewer than 32 NAND strings are in this condition, the overall erase verification passes.

If it is determined that the memory cells have been sufficiently erased (step 810), then soft programming may optionally be performed to compact the threshold voltage distribution of the erased memory cells. The process of FIG. 7C depicts one embodiment of a process for soft programming memory cells to compact an erase distribution.

If it is determined that the memory cells have not been sufficiently erased (step 810), then the erase voltage is increased by a step size in step 812 for the next erase pulse. The erase voltage can be increased by any desired amount such as 0.2 V, 0.5 V, 1.0 V, etc. Then control passes to step 802 to apply the increased erase pulse.

Figure 7C:
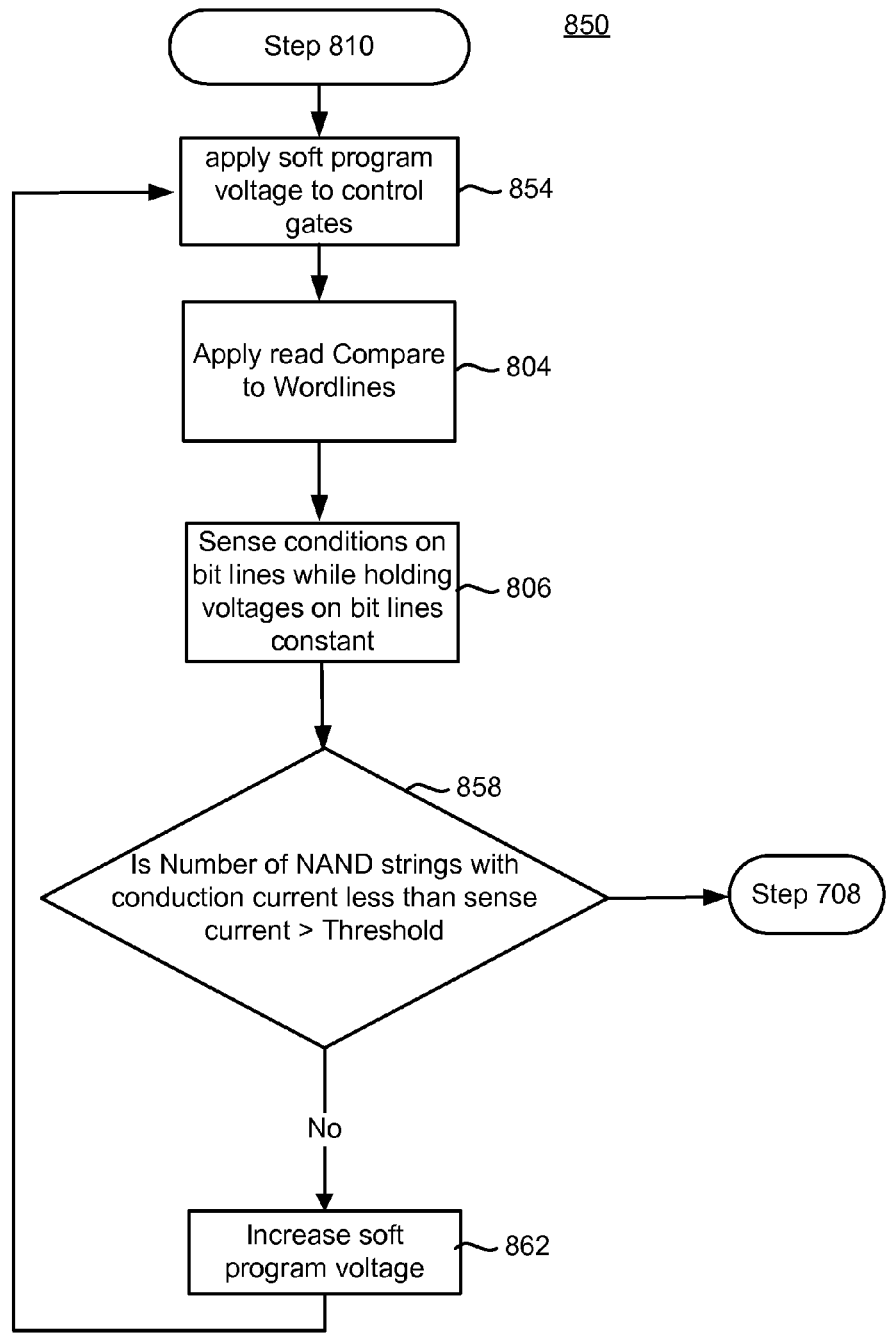
FIG. 7C depicts one embodiment of soft programming memory cells.

FIG. 7C is a flow chart describing a process 850 for compacting an erase distribution with soft programming following erasing memory cells. Process 850 may be used to implement step 707 of FIG. 7A. Process 850 begins after step 810 in process 800 of FIG. 7B results in a determination that the memory cells are sufficiently erased. In step 854 of process 850, one or more soft programming pulses are applied to the memory cells that were erased in process 800 of FIG. 7B. As previously discussed, soft programming is intended to nudge the threshold voltages of memory cells with the lowest threshold voltages upwards without causing memory cells to be programmed to a threshold voltage above a certain level. That level could be the erase target level. Thus, one technique to verify whether soft programming should stop is to test whether there are one or another number of memory cells that have a threshold voltage above a certain level.

In step 804, compare voltages (e.g., 0 Volts) are applied to the word lines. In step 806, conditions are sensed on the bit lines in the block while holding the difference between voltages on the bit lines constant. Steps 804 and 806 are similar to corresponding steps in process 800 of FIG. 8.

In step 858, a determination is made as to how many of the NAND strings have a conduction current that is less than the sense current. If that number of NABD strings is greater than a threshold, then the memory cells are now ready for programming, which may be performed as in step 708 of FIG. 7A. If that number has not yet reached the threshold, then soft programming is not yet complete. In this case, the soft programming voltage is increased in step 862 by a step size, such as 0.1 V, 0.2 V, etc. Process 850 continues at step 854 and the new soft programming voltage is applied.

FIGS. 8(A)-8(J) depicts timing diagrams that explain one embodiment of sense module 300 during erase verify and soft program verify operations. Note that the following technique is different from the technique used when determining or verifying the data state in which a memory cell is programmed. Specifically, fewer passes (strobes) are performed in an erase verify because there is not an attempt to shut down the most strongly conducting memory cells for an erase (or soft program) verify.

Phase (0): Setup

The sense module 300 (see FIG. 4C) is connected to the corresponding bit line via an enabling signal BLS (FIG. 8(A)). The Voltage clamp is enabled with BLC (FIG. 8(B)). Pre-charge transistor 642 is enabled as a limited-current source with a control signal FLT (FIG. 8(C)).

Phase (1): Controlled Pre-Charge

Sense amplifier 600 is initialized by a reset signal RST (FIG. 8(D)) which will pull the signal INV (FIG. 8(H)) to ground via transistor 658. Thus, on reset, INV is set to LOW. At the same time, p-transistor 663 pulls a complementary signal LAT to $V_{dd}$ or HIGH (FIG. 8(H)). That is, LAT is the complement of INV. Isolation transistor 634 is controlled by the signal LAT. Thus, after reset, isolation transistor 634 is enabled to connect sense node SEN2 to the sense amplifier's internal sense node SEN.

Pre-charge transistor 642 pre-charges the bit line BL through the internal sense node SEN and the sense node SEN2 for a predetermined period of time. This will bring the bit line to an optimal voltage for sensing the conduction therein. Pre-charge transistor 642 is controlled by the control signal FLT ("FLOAT"). The bit line will be pulled up towards the desired bit line voltage as set by the bit line voltage clamp 612. The rate of pull-up will depend on the conduction current in the bit line. The smaller the conduction current, the faster the pull-up.

Note that when performing a read to determine data states as depicted in FIG. 5 there is phase for "D.C. latching and removing high current cells from subsequent strobes." That is, the most strongly conducting bit lines are identified and prevented from conducting. In some embodiments for erase (and soft program) verify the D.C. latching and shutting down of bit lines is not performed. As previously discussed, bit lines with the highest current during a read operation may be unable to be pre-charged sufficiently to turn off p-transistor 656. That is, a limited charging current is used to charge the bit lines. Furthermore, recall that when performing a read operation, circuitry was used to identify bit lines that failed to charge and to prevent those bit line currents from contributing to source line bias.

In one embodiment, a higher charging current is used when performing erase state operations than for data state operations such that all, or at least most, of the bit lines will be charged to a pre-determined voltage (e.g., 0.5 V). Recall that when performing a data state operation (see FIG. 5) that bit lines that failed to charge to a sufficient voltage were identified in the DC latching stage and removed from subsequent strobes. By using a high enough charging current no (or very few) bit lines will be removed from subsequent strobes even if a DC latching stage were to be used for erase state operations. In one embodiment, the same pre-charge current is used during erase verify as was used during read. Thus, some bit lines may not charge fully. However, the circuitry that prevents those strongly conducting bit lines from contributing to source line bias during a data state operation is disabled during erase verity. This is reflected in FIG. 8 by not having a DC latching stage. Therefore, the most strongly conducting bit lines are not removed from subsequent strobes and do contribute to source line bias during erase verify.

In one embodiment, the bit line voltage that is applied to the bit line during the erase verify (or soft program verify) operation is increased relative to the bit line voltage that is applied during a data state operation. In one implementation, the bit line voltage is set at 0.7 V during the erase verify or soft program verify. In one implementation, the bit line voltage for a data state operation is established anywhere from 0.35 to 0.5 V. By increasing the bit line voltage during the erase verify (relative to a data state operation), there will be more source line bias, which will increase the apparent threshold voltage. That is, the threshold voltage measured with the higher bit line voltage will be higher than the threshold voltage measured using a lower bit line voltage. Therefore, a more negative threshold voltage can be sensed while still applying a non-negative voltage to the word lines.

Phase (2): A.C. Sensing

In one embodiment, an A.C. (Alternating Current or transient) sensing is performed by determining the voltage drop at the floated internal sense node SEN. This is accomplished by the discriminator circuit employing the capacitor Csa coupled to the internal sense node SEN, and considering the rate the conduction current is charging it (reducing the voltage on node SEN). Note that in some embodiments, in order to sense more negative threshold voltages, the demarcation current is increased. The demarcation current for the erase state operation can be set by appropriate adjustment of the sensing period.

The discriminator circuit senses the signal SEN in the internal sense node SEN. Prior to each sensing, the signal at the internal sense node SEN is pulled up to $V_{dd}$ by pre-charge transistor 642. This will initially set the voltage across the capacitor Csa to be zero. When the sense amplifier 600 is ready to sense, the precharge circuit is disabled by FLT going HIGH (FIG. 8(C)). The sensing period S1 is ended by the assertion of the strobe signal STB. During the sensing period, a conduction current induced by a conducting memory cell will charge the capacitor. The voltage at SEN will decrease from $V_{dd}$ as the capacitor Csa is charged through the draining action of the conduction current in the bit line.

Note that sensing period S1 is not necessarily the same as sensing period ST1 used during a data state read/verify operation, although it may be the same. Note that the embodiment of FIG. 5 uses different lengths of sensing periods. However, the initial sensing AC sensing period is used to sense strongly conducting bit lines. The second sensing period (T2) of FIG. 5 tests for the lowest conduction current a memory cell can have and still be considered to be on. In one embodiment, the sensing period for erase state operations (S1) is the same length of time as T2 for data state operations. Thus, memory cells need to have the same conduction current in each case to be considered to be on.

A technique that can be used to sense threshold voltages at an even more negative voltage is to reduce the sensing period S1. In one implementation, a first second period (e.g., T2 of FIG. 5) is used for data state operations and a second sensing period (e.g., 51 of FIG. 8) is used for erase state operations, such as erase verify or soft program verify. The sensing period S1 for erase state operations may be shorter than the sensing period T2 for data state operations. Reducing the sensing period in effect increases the sensing (demarcation) current. For a greater demarcation current the memory cell will need to have a greater conduction current. However, to have a greater conduction current (for a given control gate to source voltage) a memory cell needs to have a lower threshold voltage. Consequently, the effect is to test for a more negative threshold voltage (assuming that a somewhat negative threshold voltage is already being tested for).

Phase (3): A.C. Latching

At the end of the predetermined sensing period S1, the SEN node will have decreased to some voltage depending on the conduction current in the bit line. The capacitor Csa, the sensing period S1 and the threshold voltage of the p-transistor 656 are such that the signal at SEN corresponding to a conduction current higher than the demarcation current will drop sufficiently low to turn on the transistor 656 (curve G1). When latching signal STB strobes LOW, the output signal INV will be pulled HIGH, and will be latched by the latch 482 (FIG. 8(E) and FIG. 8(H1)).

On the other hand, the signal SEN corresponding to a conduction current below the demarcation will produce a signal SEN unable to turn on the transistor 656 current (FIG. 8(G2)). In this case, the latch 482 will remain unchanged, in which case LAT remains HIGH (FIG. 8(H2)). Thus, it can be seen that the discriminator circuit effectively determines the magnitude of the conduction current in the bit line relative to a reference current set by the sensing period.

Sense amplifier 600 also includes the second voltage clamp transistor 612 whose purpose is to maintain the voltage of the drain of the transistor 612 sufficiently high in order for the bit line voltage clamp 610 to function properly. As described earlier, the bit line voltage clamp 610 clamps the bit line voltage to a predetermined value $V_{BL}$, e.g., 0.5V. This will require the gate voltage BLC of the transistor 612 to be set at $V_{BL}+V_T$ (where $V_T$ is the threshold voltage of the transistor 612) and the drain connected to the sense node 501 to be greater than the source, i.e., the signal SEN2>$V_{BL}$. In particular, given the configurations of the voltage clamps, SEN2 should be no higher than the smaller of XXO−$V_T$ or BLX−$V_T$, and SEN should be no lower. During sensing, the isolation gate 630 is in a pass-through mode. However, during sensing the signal at the internal sense node SEN has a voltage that decreases from $V_{dd}$. The second voltage clamp prevents SEN from dropping below XXO−$V_T$ or BLX−$V_T$, whichever is lower. This is accomplished by an n-transistor 612 controlled by a signal BLX, where BLX is ≧$V_{BL}+V_T$. Thus, through the actions of the voltage clamps, the bit line voltage $V_{BL}$ is kept constant, e.g., ~0.5V, during sensing.

The output of the current determination is latched by the latch circuit 482. The latch circuit is formed as a Set/Reset latch by the transistors 661, 662, 663 and 664 together with the transistors 666 and 668. The p-transistor 666 is controlled by the signal RST (RESET) and the n-transistor 668 is controlled by the signal STB. A variation of the above-described sense amplifier that is adapted for low voltage operation is found in U.S. Pat. No. 7,046,568 titled "Improved Memory Sensing Circuit And Method For Low Voltage Operation," Inventor Raul-Adrian Cernea, incorporated herein by reference in its At the end of the predetermined sensing period S1, SEN will have decreased to some voltage depending on the conduction current in the bit line (FIG. 8(G) (curves G1 and G2)).

In this case, a memory cell with a relatively high conduction current will have its INV latched HIGH (FIGS. 8 (G1) and 8(H1)) and its bit line subsequently pulled to ground (not depicted in FIG. 8). On the other hand, a memory cell with a relatively low conduction current will have no effect on the state of the latch, which was preset with LAT HIGH (FIGS. 8(G2) and 8(H2)).

Phase (4): Read Out to the Bus

Finally, in the read out phase, the control signal NCO at the transfer gate 530 allows the latched signal SEN2 to be read out to the readout bus 532 (FIGS. 10(I) and 10(J)).

The techniques described herein to measure the threshold voltages of memory cells allow negative threshold voltages to be measured without applying a negative voltage to the control gates. The discussion of FIGS. 9A and 9B to follow will illustrate how such sensing of negative threshold voltages can be achieved. Moreover, the techniques described herein are much faster than techniques such as a source follower technique described in the background.

Figure 9A:
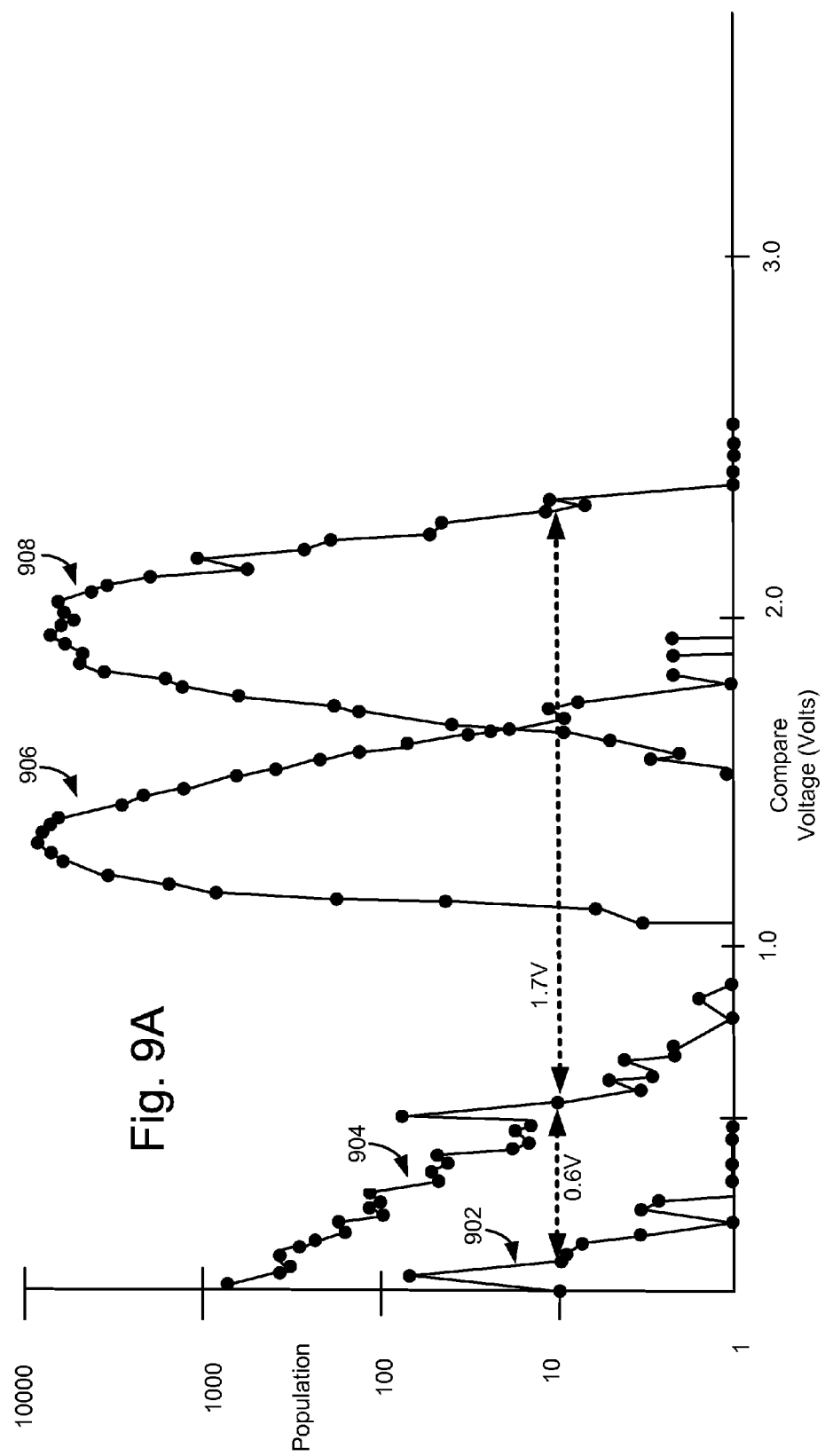
FIG. 9A is a diagram of several different measured threshold voltage distributions.

FIG. 9A is a diagram of several different measured threshold voltage distributions (902-908). Each distribution is for the same set of memory cells having the same actual threshold voltage distribution that resulted from applying several erase pulses to a group of memory cells. However, each distribution was measured using a different technique, resulting in measured distributions that are shifted substantially from one another.

Each data point in a given distribution is generated by applying a particular compare voltage to at least one word line and determining how many NAND strings conduct a current in response. A memory cell will (or will not) turn on based on the magnitude of its threshold voltage relative to the compare voltage. Note that for each technique in FIG. 9A a different compare voltage will cause a memory cell with a particular threshold voltage to turn on. For example, for the technique used to generate distribution 908, a compare voltage of slightly more than 2 Volts may be needed to turn on a memory cell (having a given threshold voltage) that can be turned on by a compare voltage of 0 volts when using the technique used to generate distribution 902. This is reflected by the upper end of distribution 908 being about 2 volts higher than the upper end of distribution 902.

Note that distribution 902 was derived using a technique similar to that of the technique depicted in FIG. 5. Specifically, multiple strobes were used to prevent the most strongly conducting memory cells from contributing to source line bias and Vread was applied to non-selected word lines. Distribution 908 was derived using techniques similar to the erase verify technique described in FIG. 8. Specifically, a single strobe was used such that strongly conducting bit lines were not shut down, and consequently allowed to contribute to source line bias. Furthermore, the same compare voltage was applied to all word lines for distribution 908. Distributions 904 and 906 are variations of the techniques used to generate distributions 902 and 908 and will be discussed to demonstrate how specific aspects of the techniques contribute to different apparent readings of threshold voltage. In particular, the effect that source line bias has on apparent threshold voltage is illustrated by differences in the measured distributions. Moreover, the affect on apparent threshold voltage of applying either Vread to unselected word lines versus applying the same compare voltage to all word lines will be discussed.

As discussed more fully below, depending on the technique used, either the same compare voltage is applied to each word line or, alternatively, a compare voltage is applied to a selected word line and a read pass voltage is applied to unselected word lines. The read pass voltage "Vread" (e.g., 6 V) is a voltage that is expected to cause the memory cell to conduct regardless of its threshold voltage. Thus, if the compare voltage is applied to a single word line with Vread applied to the remaining ("unselected") word lines, then the threshold voltage of a single memory cell on each NAND string is being sensed. On the other hand, if the compare voltage is applied to all word lines, then the threshold voltage of each memory cell on the NAND string is being tested. That is, no memory cell may have a threshold voltage greater than a certain magnitude if the NAND string is to conduct a current.

The individual data points on distribution 908 were determined using a compare voltages ranging from about 1.5 V to 2.5 V. Note that when performing an erase verify, a compare voltage of 0 volts may be used. The individual data points on the other distributions 902-906 are also derived by applying compare voltages reflected on the x-axis. For example, distribution 902 was generated by applying compare voltages ranging from about 0 V to 0.5 V. Note that for the technique used to generate distribution 902, the voltage threshold distribution of only a relatively few of the memory cells could be determined. The technique used to generate distribution 904 was able to determine the threshold voltage for a few more memory cells. However, the actual threshold voltage of the memory cells being tested is the same for each distribution, in other words, the actual charge on each of the measured floating gates has not been changed between obtaining the distributions under various methods.

Figure 9B:
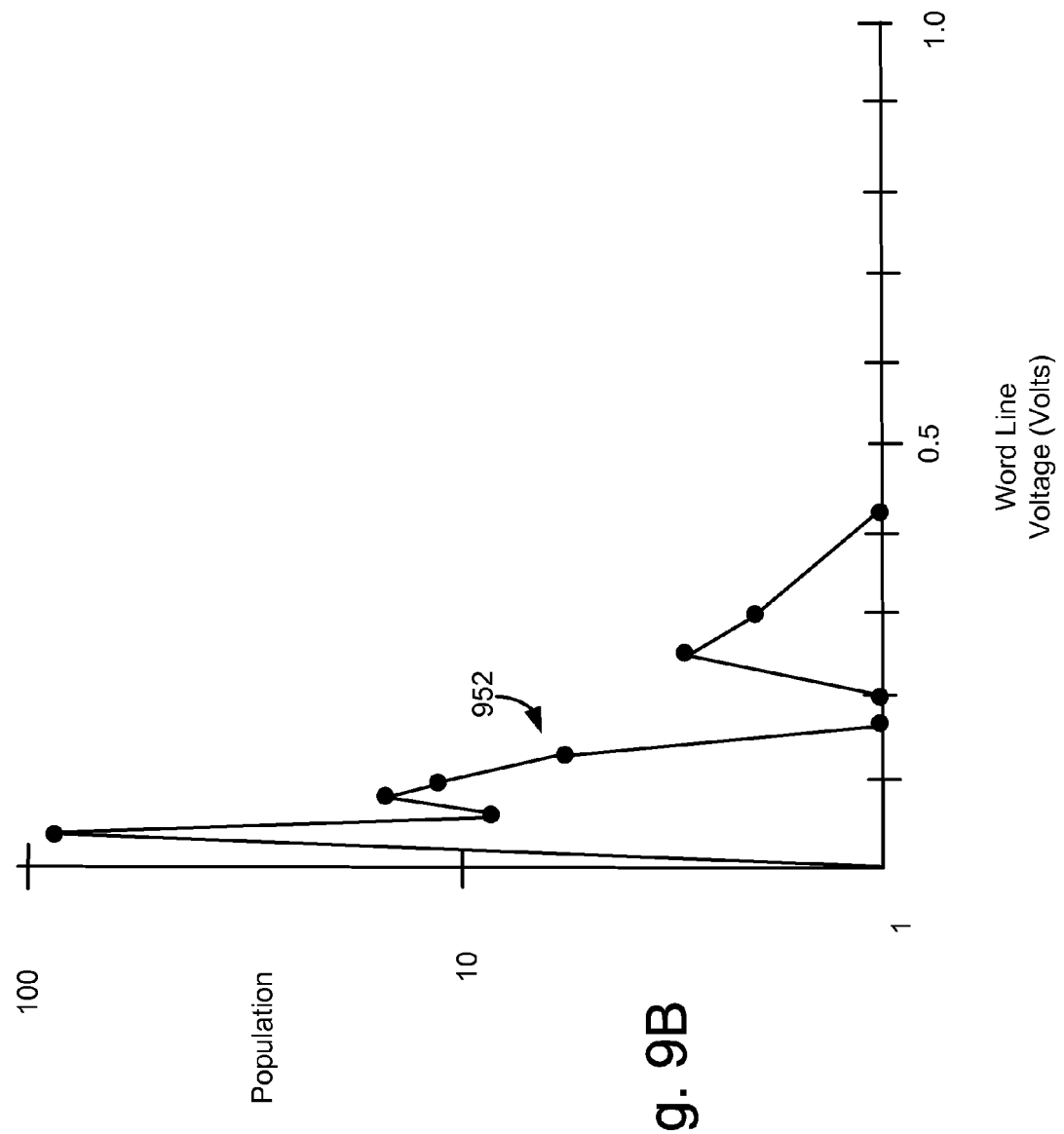
FIG. 9B depicts a threshold voltage distribution that was determined using techniques disclosed herein to sense negative threshold voltages.

Distribution 952 in FIG. 9B was generated by the same technique used to generate distribution 908 of FIG. 9A. However, the actual threshold distribution of the memory cells for FIG. 9B is substantially lower than the actual distribution of the memory cells for FIG. 9A. The memory cells for FIG. 9B were erased to about 2.5 volts more negative than the memory cells being sensed in FIG. 9A. Note that the actual voltages applied to the word lines to generate distribution 908 ranges from about 0 V to about 0.5 V (as compared to about 1.5 to 2.5 V for distribution 908). The shift between distribution 908 of FIG. 9A and distribution 952 of FIG. 9B indicates that the actual threshold voltages of the memory cells under test in FIG. 9B are substantially negative. Also note that had the techniques used to generate distributions 902 and 904 of FIG. 9A been attempted for the memory cells under test in FIG. 9B, no results would have been produced. That is, the threshold voltages are too negative for those techniques to sense a threshold voltage (assuming a non-negative compare voltage is applied to the word lines).

The technique used to generate distribution 952 is referred to herein as ABL sensing using a single pass read. The threshold voltage distribution 952 was measured by performing a series of such ABL reads, with a range of voltages to the word lines from 0 to slightly more than 0.4V. Note that the threshold voltage distribution 952 shows that threshold voltages of at least some of the memory cells are being detected. However, prior to the measurements, the memory cells were erased to about 2.5V more negative than the memory cells in FIG. 9A.

Recall that the technique used to generate distribution 902 of FIG. 9A is similar to the technique of FIG. 5 in which a multi-pass read is performed to reduce or eliminate source line bias. Further, in the technique used to generate distribution 902, "Vread" is applied to the unselected word lines and a compare voltage to the selected word line. However, note that threshold voltage distribution 952 is similar to threshold voltage distribution 902 of FIG. 9A. Thus, the ABL verify technique used to generate distribution 952 is sensing negative threshold voltages down to about −2.5 V relative to the sensing technique used to generate distribution 902.

Next, factors that affect how the measured threshold voltage is impacted by the technique used to make the measurement will be discussed. One factor affecting the measured threshold voltage is the amount of source line bias. In the example provided in FIG. 9A, the shift in apparent threshold voltage for the upper end of distribution 904, as compared to the upper end of distribution 902 is about 0.6 Volts, which corresponds to a $V_{drop}$ of 0.6 Volts. However, depending on the resistance, number of bit lines with a significant current, and the current per bit line, the shift could be significantly different.

Note that the amount of source line bias is a function of the number of memory cells that conduct (turn on) in response to a given data state operation. Parallel sensing of memory cells that are electrically connected to a common source line results in a substantial current through the source line. Because the source line has a significant resistance, the current passing through the source line results in an appreciable potential difference between the true ground and the source electrode of each memory cell. During sensing, the threshold voltage supplied to the control gate of each memory cell is relative to its source electrode; however, the system power supply is relative to the true ground. Thus, sensing may be affected by the source line bias.

Note that if the number of NAND strings that are expected to conduct during a given sense operation is unknown, then the amount of source line bias will not be known. Therefore, when data state operations are performed to determine the states of memory cells, a technique such as that depicted in FIG. 5 reduces or eliminates source line bias.

However, in some embodiment that perform erase state operations, source line bias is allowed to occur. Note that while the apparent shift in threshold voltage due to source line bias will be a function of the state of the memory cells, during certain operations a very good estimate of the state of the memory cells can be determined. For example, during an erase verify operation or a soft program verify operation, an assumption can in some cases be made that most of the memory cells will have a threshold voltage that is below a target level. With this assumption, along with knowledge of the control gate voltage that will be used during the operation, a good approximation of the total current from all of the bit lines during the operation can be made. Moreover, the resistance in the ground loop can be determined by engineering qualifications. Thus, the apparent shift in threshold voltage can be determined based on certain assumptions. Referring again to FIG. 9A, multi-pass reading was used to eliminate source line bias when determining threshold voltage distributions 902 and 906, whereas single pass reading (similar to that depicted in FIG. 8) was used to determine distributions 904 and 908.

The foregoing allows a determination of a negative threshold voltage under certain conditions. For example, by applying zero volts (supplied threshold voltage in FIG. 10) to all of the word lines in a block and determining an expected amount of source line bias (e.g., $V_{drop}$ of 0.6V), a negative threshold voltage (e.g., effective threshold voltage of −0.6 V) can be sensed. Note that this technique does not require that a negative voltage be applied to the word lines. Moreover, sensing the threshold voltage is a very efficient operation. As has already been discussed, this type of sensing can be performed using a sense capacitor whose capacitance is selected for fast sensing.

Another factor affecting the measured threshold voltage of a memory cell is the voltage applied to adjacent word lines.

For example, in one technique a compare voltage (e.g., 0 V) is applied to the selected word line, whereas Vread (e.g., 6.0 V) is applied to other (unselected) word lines. Since Vread is being applied to all unselected word lines, this technique is used to sense the conditions of only the memory cells on the selected word line. In another technique the same compare voltage (e.g., 0 V) is applied to all word lines. This technique, in effect, tests whether at least one memory cell on each NAND string has a threshold voltage greater than a certain amount. Thus, this latter technique tests on a NAND string basis. Note that when a particular compare voltage (e.g., 0 V) is applied to a given memory cell, the measured threshold voltage will be different depending on what voltage is applied to adjacent word lines. This effect will be referred to herein as the adjacent word line voltage differential effect, or the adjacent word line effect for brevity. The distributions in FIG. 9A will be referred to in order to illustrate the adjacent word line effect.

In FIG. 9A, distributions 902 and 904 were derived by applying "Vread" to the unselected word lines and a compare voltage to the selected word line. On the other hand, distributions 906 and 908 result from applying the same voltage to all of the word lines during each of the individual reads that were used to determine the distributions 906, 908. Distribution 906 is shifted significantly to the right from distribution 902, demonstrating the difference in apparent threshold voltage that occurs due to the adjacent word line effect. Similarly, distribution 908 is shifted to the right from distribution 904. The adjacent word line effect is about 1.7 Volts between the two selected points in FIG. 9A (one point on each of distributions 904 and 908). However, note that the magnitude of the adjacent word line effect may be substantially different when voltages other than those used to generate the threshold voltage distributions in FIG. 9A are used.

FIG. 11A depicts the voltages applied to selected and unselected word lines when reading to determine the point on distribution 904 corresponding to 0.6 Volts on the threshold voltage axis. That is, 0.6V was a compare voltage applied to the selected word line and a Vread of 6.0V was applied to the unselected word lines. FIG. 11B depicts the voltages applied to all word lines when reading to determine the point on distribution 908 corresponding to 2.2 Volts on the threshold voltage axis. In this case 2.2 V was applied to all word lines. In order to analyze the impact on a particular memory cell, one of the word lines in FIG. 11B is referred to as a "selected" word line and the other word lines will be referred to as "unselected word lines." Note that the voltage applied to unselected word lines in FIG. 11A is 6.0 Volts (Vread), whereas the voltage applied to unselected word lines in FIG. 11B is 2.2 V. Thus, the difference in voltage applied to unselected word lines for the two cases is 3.8 Volts. Further note that the shift due to the adjacent word line effect depicted for this point on distributions 904 and 908 is above 1.7 V. Note that if the voltage applied to the unselected word lines is lower, then the impact of the adjacent word line effect may be greater. For example, if 0 volts is applied to all word lines, then the adjacent word line effect (as compared to applying Vread of 6.0 on unselected word lines) may be even greater than 1.7 V.

By noting the impact of the adjacent word line effect on threshold voltage measurement, it may be possible to avoid erasing the memory cells to as deep a level as in done to compensate for various effects. A main reason that such deep erase levels are deemed to be desirable is due to what will be referred to herein as "floating gate to floating gate coupling effect (or simply "FG-FG coupling") which can be experienced by an erased cell that has all of its eight neighbors subsequently programmed to either high threshold voltage states or the highest threshold voltage state. The eight neighbors of each cell consist of four diagonal neighbors, two WL-WL neighbors, and two BL-BL neighbors. In one implementation, FG-FG coupling effects may be as follows: diagonal: 60 mV, WL-WL: 250 mV, BL-BL: 150 mV. These values are based on 6V threshold voltage difference between the neighbor cells and the cell whose threshold voltage is being determined. Assuming a 6V threshold voltage swing from erased to highest threshold voltage state, the total FG-FG coupling effect that can be experienced by an erased memory cell that remains erased and has all its eights neighbors go to the highest threshold voltage state is 890 mV. In order to prevent an erased cell from being erroneously read as being programmed to a data state, the memory cells may be erased to a very deep level such as −3V.

However, note that the adjacent word line effect compensates for the FG-FG coupling effect. Thus, the foregoing observations regarding the adjacent word line effect may be used to reduce the depth to which erasing is performed. That is, as long as the erase verify (or soft program verify) is performed with word line voltages that are substantially less than used (on unselected word lines) during a data state operation, the memory cells may not need to be erased to an extremely negative state. For example, memory cells are sometimes erases to −3 V. However, because of the adjacent word line effect, such deep erases may not be necessary. Erasing the memory cells to a less negative value reduces stress on the memory cells and makes sensing the negative threshold voltages easier.

For the following additional reasons, the memory cells may not need to be erased so deeply. The techniques disclosed herein may be less susceptible to cell to cell variations than conventional techniques to perform erase or soft program verify. Less variation not only results in more accurate measurement, but can allow erasing to less negative values as less of a guard band is needed for errors in measurement. For example, there are significant cell to cell variations of body effect and drain induced barrier lowering (DIBL), which is a reduction of threshold voltage that occurs at higher drain voltages. Thus, if two sensing techniques cause a different amount of these effects, then discrepancies may arise in threshold voltage determination. For example, an erase verify that uses the source follower technique described in the background section may be very different than a data state operation as depicted in FIG. 5. That is, the source follower technique engages large amounts of body effect and large amounts of DIBL, whereas the read technique may not. One way to compensate for the cell to cell variations of body effect and of DIBL is to erase the memory cells to a very deep level. The erase verify and soft program verify techniques described herein may engage significantly less body effect than the source follower technique. Thus, there is not much difference in the body effect between the erase verify and a data state operation. Moreover, there is not much discrepancy in DIBL between an erase verify described herein and a data state operation. Therefore, smaller verify depth margins are required with techniques described here. This can lead to gentler erase operations, which can add to the cycling endurance of the memories.

The above examples are provided with respect to NAND type flash memory. However, the principles of the present invention have application to other types of non-volatile memories, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for erasing non-volatile storage, the method comprising:
    applying one or more erase pulses to a group of non-volatile storage elements, the group of non-volatile storage elements are associated with a plurality of bit lines, the group of non-volatile storage elements are associated with a plurality of word lines;
    applying one or more non-negative compare voltages to at least a portion of the plurality of word lines after applying the one or more erase pulses;
    allowing strong conduction currents of the plurality of bit lines to contribute to source line bias;
    sensing conditions of the bit lines, the sensing is performed while applying the one or more compare voltages and allowing the strong conduction currents to contribute to source line bias;
    determining whether the group of non-volatile storage elements are sufficiently erased to a negative threshold voltage based on the conditions; and
    applying at least one additional erase pulse to the group of non-volatile storage elements if the group of non-volatile storage elements are not sufficiently erased.

2. A method as recited in claim 1, wherein the word lines includes a plurality of data word lines and at least one dummy word line, and the applying the non-negative compare voltage includes applying the non-negative compare voltage to each data word line.

3. A method as recited in claim 1, wherein the one or more non-negative compare voltages are zero volts.

4. A method as recited in claim 1, wherein the allowing strong conduction currents of the plurality of bit lines to contribute to source line bias includes allowing the strong conduction currents to increase a voltage on a common source line that is coupled to the plurality of bit lines.

5. A method as recited in claim 4, wherein the determining whether the group of non-volatile storage elements are sufficiently erased is further based on the increase in voltage on the common source line.

6. A method as recited in claim 1, wherein the sensing conditions includes sensing both odd and even bit lines together.

7. A non-volatile storage device comprising:
    a group of non-volatile storage elements;
    a plurality of bit lines, the group of non-volatile storage elements are associated with the plurality of bit lines;
    a plurality of word lines associated with the group of non-volatile storage elements; and
    one or more managing circuits in communication with the group of non-volatile storage elements, the plurality of word lines, and the plurality of bit lines, the one or more managing circuits apply one or more erase pulses to the group of non-volatile storage elements, the one or more managing circuits apply one or more non-negative compare voltages to at least a portion of the plurality of word lines after applying the one or more erase pulses, the one or more managing circuits allow strong conduction currents of the plurality of bit lines to contribute to source line bias, the one or more managing circuits sense conditions on the bit lines while applying the one or more compare voltages and while allowing the strong conduction currents to contribute to source line bias, the one or more managing circuits determine whether the group of non-volatile storage elements are sufficiently erased to a negative threshold voltage based on the conditions, the one or more managing circuits apply at least one additional erase pulse to the group of non-volatile storage elements if the group of non-volatile storage elements are not sufficiently erased.

8. The non-volatile storage device of claim 7, wherein the word lines includes a plurality of data word lines and at least one dummy word line, the one or more managing circuits apply the non-negative compare voltage to each data word line.

9. The non-volatile storage device of claim 7, wherein the one or more non-negative compare voltages are zero volts.

10. The non-volatile storage device of claim 7, further comprising a common source line coupled to the plurality of bit lines, wherein to allow strong conduction currents of the plurality of bit lines to contribute to source line bias the one or more managing circuits allow the strong conduction currents to increase a voltage on the common source line.

11. The non-volatile storage device of claim 10, wherein the one or more managing circuits factor in the increase in voltage on the common source line to determine whether the group of non-volatile storage elements are sufficiently erased.

12. The non-volatile storage device of claim 11, wherein, when the one or more managing circuits sense the conditions on the bit lines, the one or more managing circuits sense conditions on both odd and even bit lines together.

13. A non-volatile storage device comprising:
   a plurality of bit lines;
   a plurality of NAND strings of non-volatile storage elements, the NAND strings are associated with the plurality of bit lines;
   a plurality of word lines associated with the non-volatile storage elements; and
   one or more managing circuits in communication with the plurality of NAND strings, the plurality of word lines, and the plurality of bit lines, the one or more managing circuits apply one or more erase pulses to the non-volatile storage elements, the one or more managing circuits apply one or more non-negative compare voltages to at least a portion of the plurality of word lines after applying the erase pulse, the one or more managing circuits sense conditions on the bit lines while holding differences between voltages on the bit lines substantially constant, the sensing is performed while applying the one or more compare voltages, the one or more managing circuits determine whether the NAND strings of non-volatile storage elements are sufficiently erased based on the conditions, the one or more managing circuits apply at least one additional erase pulse to the NAND strings of non-volatile storage elements if the NAND strings of non-volatile storage elements are not sufficiently erased.

14. A non-volatile storage device as recited in claim 13, wherein the non-negative compare voltage is zero volts.

15. A non-volatile storage device as recited in claim 13, wherein the word lines includes a plurality of data word lines and at least one dummy word line, the one or more managing circuits apply the non-negative compare voltage to each data word line.

16. A non-volatile storage device as recited in claim 13, wherein the one or more managing circuits apply the non-negative compare voltage to non-negative compare voltage to the at least one dummy word line.

17. A non-volatile storage device as recited in claim 13, wherein the one or more managing circuits determine that the non-volatile storage elements are sufficiently erased based on the conditions, the one or more non-negative compare voltages are first non-negative compare voltages, the one or more managing circuits apply one or more soft programming pulses to the non-volatile storage elements after determining that the non-volatile storage elements are sufficiently erased, the one or more managing circuits apply one or more second non-negative compare voltages to at least a portion of the plurality of word lines after applying the soft programming pulse, the one or more managing circuits sense conditions on the bit lines while holding differences between voltages on the bit lines substantially constant, the sensing is performed while applying the one or more second compare voltages, the one or more managing circuits determine whether the group of non-volatile storage elements are sufficiently soft programmed based on the conditions sensed while applying the one or more second compare voltages, the one or more managing circuits apply at least one additional soft programming pulse to the non-volatile storage elements if the non-volatile storage elements are not sufficiently soft programmed.

18. A non-volatile storage device as recited in claim 13, wherein the one or more managing circuits applying the non-negative compare voltage to the plurality of word lines causes an increase in voltage on a common source line due to currents associated with the bit lines, the one or more managing circuits determine whether the non-volatile storage elements are sufficiently erased based at least in part on the increase in voltage on the common source line.

19. A non-volatile storage device as recited in claim 13, wherein the one or more managing circuits maintain a first voltage on a first bit line of the bit lines while sensing the conditions, the one or more managing circuits determine a data state in which a non-volatile storage element on the first bit line is programmed, the one or more managing circuits determine the data states includes maintaining a second voltage on the first bit line when determining the data state, the second voltage is less than the first voltage.

20. A non-volatile storage device as recited in claim 13, wherein the one or more managing circuits program the non-volatile storage elements to various data states, the sensing conditions includes sensing for a first integration time, the conditions are first conditions, the one or more managing circuits sense second conditions on the bit lines while holding differences between voltages on the bit lines substantially constant, the sensing second conditions is performed after the programming to determine the data states of at least some of the group of non-volatile memory cells, the sensing second conditions is performed for a second integration time, the first integration time is less than the second integration time.

21. A non-volatile storage device as recited in claim 13, wherein the one or more managing circuits sense conditions to determine whether the NAND strings are sufficiently erased without preventing conduction currents of bit lines of the plurality of bit lines that have a strong conduction current from contributing to source line bias.

22. A method for soft programming non-volatile storage in connection with an erase operation, the method comprising:
   erasing a group of non-volatile memory elements that are associated with a plurality of bit lines and a plurality of word lines;

applying one or more non-negative compare voltages to at least a portion of the plurality of word lines as part of a soft programming operation after the erasing;

allowing strong conduction currents of the plurality of bit lines to contribute to source line bias;

sensing conditions of the bit lines, the sensing is performed while applying the one or more non-negative compare voltages and allowing the strong conduction currents to contribute to source line bias; and comparing threshold voltages of the non-volatile storage elements in the group to a target negative threshold voltage based on the conditions.

23. The method of claim 22, wherein the sensing conditions on the bit lines further includes holding differences between voltages on the plurality of bit lines substantially constant.

24. A non-volatile storage device comprising:
a plurality of NAND strings of non-volatile storage elements;
a plurality of bit lines, the NAND strings are associated with the plurality of bit lines;
a common source line the is coupled to the plurality of NAND strings;
a plurality of word lines associated with the non-volatile storage elements; and
one or more managing circuits in communication with the plurality of NAND strings, the plurality of word lines, and the plurality of bit lines, the one or more managing circuits erase the non-volatile memory elements, the one or more managing circuits apply one or more non-negative compare voltages to at least a portion of the plurality of word lines as part of a soft programming operation after the erasing, the one or more managing circuits allow strong conduction currents of the plurality of bit lines to contribute to source line bias of the common source line, the one or more managing circuits sense conditions on the bit lines while applying the one or more non-negative compare voltages and while allowing the strong conduction currents to contribute to source line bias, the one or more managing circuits compare threshold voltages of the non-volatile storage elements to a target negative threshold voltage based on the sensed conditions.

25. The non-volatile storage device of claim 24, wherein the one or more managing circuits hold differences between voltages on the plurality of bit lines substantially constant while sensing the conditions on the bit lines.

* * * * *